United States Patent
Parikh

(10) Patent No.: US 7,123,064 B2
(45) Date of Patent: Oct. 17, 2006

(54) DIGITAL PHASE SHIFT CIRCUITS

(75) Inventor: Parag Parikh, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 8 days.

(21) Appl. No.: 10/956,848

(22) Filed: Oct. 1, 2004

(65) Prior Publication Data

US 2006/0071698 A1    Apr. 6, 2006

(51) Int. Cl.
*H03L 7/06* (2006.01)
(52) U.S. Cl. ...................... 327/149; 327/231
(58) Field of Classification Search ........ 327/231–237, 327/149, 153, 158, 161, 262, 263; 331/17, 331/25, DIG. 2; 375/373, 375, 376
See application file for complete search history.

(56) References Cited

U.S. PATENT DOCUMENTS

| 5,838,179 | A * | 11/1998 | Schmidt ..................... 327/156 |
| 6,737,901 | B1 * | 5/2004 | Hein et al. .................. 327/270 |
| 6,839,860 | B1 * | 1/2005 | Lin ............................ 713/401 |
| 2005/0189974 | A1 * | 9/2005 | Chao .......................... 327/158 |
| 2005/0280407 | A1 * | 12/2005 | Loke et al. .............. 324/76.54 |

* cited by examiner

*Primary Examiner*—Linh My Nguyen

(57) ABSTRACT

Techniques are presented for creating a second clock signal by using a first clock signal. For instance, an output is determined that corresponds to a phase relationship between the first and second clock signals. A value, corresponding to a given one of a plurality of delays, is selected based at least partially on the output. The given delay is created, by using the value, on the first clock signal to produce the second clock signal, whereby the given delay creates a phase shift between the first and second clock signals.

33 Claims, 15 Drawing Sheets

DIGITAL PHASE SHIFT CIRCUITS

FIELD OF THE INVENTION

The present invention relates generally to integrated circuits, and, more particularly, to clock circuits in integrated circuits.

BACKGROUND OF THE INVENTION

A Phase-Locked Loop (PLL) is one type of clock circuit that compares input and output clock signals and attempts to create the output clock signal so that the output clock signal is aligned with the input clock signal. Alignment means that an edge of the output clock signal occurs at about the same time (e.g., within a small error) from an edge of the input clock signal. Generally, rising edges are used so that a rising edge of the output clock signal occurs at about the same time as a rising edge of the input clock signal. Typical PLLs comprise a phase comparator, low pass filter, and Voltage Controlled Oscillator (VCO). The phase comparator compares the input and output clock signals and produces an output that is related to a comparison between the input and output clock signals. For example, in a digital PLL, a phase comparator might produce an output proportional to a time difference between edges of the input and output clock signals. In an analog PLL, by contrast, a phase comparator might produce an output determined by an analog multiplication of the input and output clock signals. The filter acts to smooth the output of the phase comparator, and the VCO oscillates at a rate proportional to the voltage applied to the VCO from an output of the filter.

PLLs are used in a wide variety of situations, such as clock recovery from encoded digital streams, synchronization of clock signals, synchronization of input and output data, and locking onto a signal such as a radio signal. While PLLs are widely used, some problems with PLLs exist. For instance, conventional PLLs typically have some static phase error. This static phase error means that the edges of the input and output clock signals will never be exactly aligned. Moreover, PLLs typically do not provide variable phase shift capability. Instead, aside from the static phase error, the input and output clock signals are aligned (e.g., a phase shift of zero). Additionally, the PLLs have a loop noise bandwidth, which describes the effective bandwidth of the input clock signal. Noise and signal components outside the loop noise bandwidth are attenuated. Furthermore, conventional PLLs can take a large area on a semiconductor, can use quite a large amount of power, and contain variables that can be process, temperature, and voltage sensitive.

A need therefore exists for circuits that can use an input clock signal as a reference to provide an output clock signal and that can also provide variable phase shift, relative to the input clock signal, of the output clock signal.

SUMMARY OF THE INVENTION

Generally, digital phase shift circuits are provided. Such digital phase shift circuits can use an input clock signal as a reference to provide an output clock signal and also can provide variable phase shift, relative to the input clock signal, of the output clock signal.

In an exemplary embodiment, techniques are presented for creating a second clock signal using a first clock signal. For instance, an output is determined that corresponds to a phase relationship between the first and second clock signals. A value, corresponding to a given one of a plurality of delays, is selected based at least partially on the output. The given delay is created, by using the value, on the first clock signal to produce the second clock signal, whereby the given delay creates a phase shift between the first and second clock signals.

A more complete understanding of the present invention, as well as further features and advantages of the present invention, will be obtained by reference to the following detailed description and drawings.

DETAILED DESCRIPTION

Aspects of the present invention provide methods and apparatus for digital phase shifting. One type of digital phase shifting is phase alignment, where there is a phase shift of zero between an input clock signal (e.g., a reference clock signal) and an output clock signal. Embodiments of the present invention allow a clock signal to be phase shifted from a reference clock signal. Certain embodiments allow a clock signal that has passed through all or a portion of a clock tree to be aligned with a reference clock signal. For purposes of exposition, clock and other signals described herein will be described as signals without reference to the conductive lines on which the signals are placed.

Figure 1:
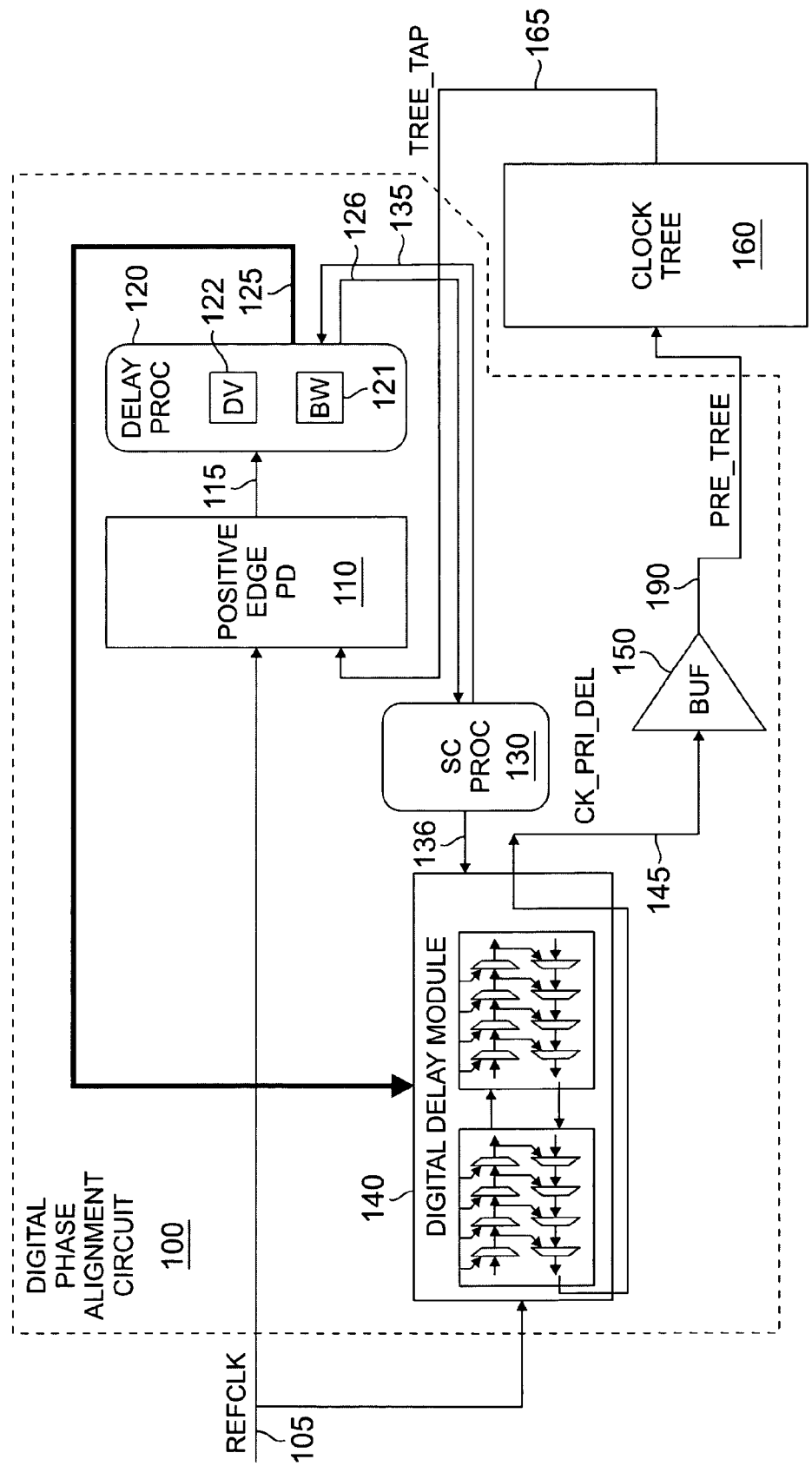
FIG. 1 is a block diagram of a digital phase alignment circuit coupled to a clock tree in accordance with an illustrative embodiment of the invention.
Figure 10:
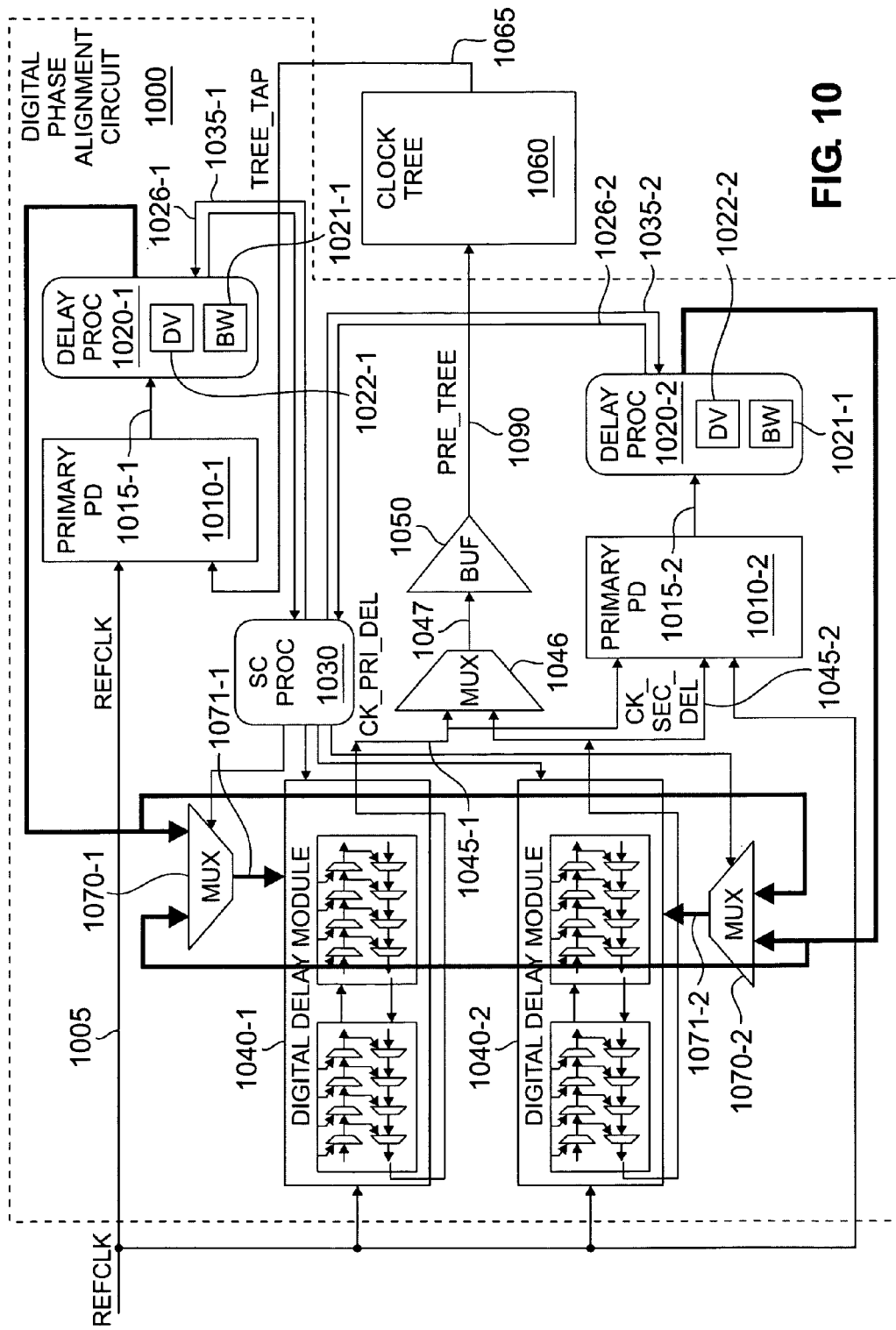
FIGS. 10 and 11 are additional exemplary digital phase alignment circuits.
Figure 11:
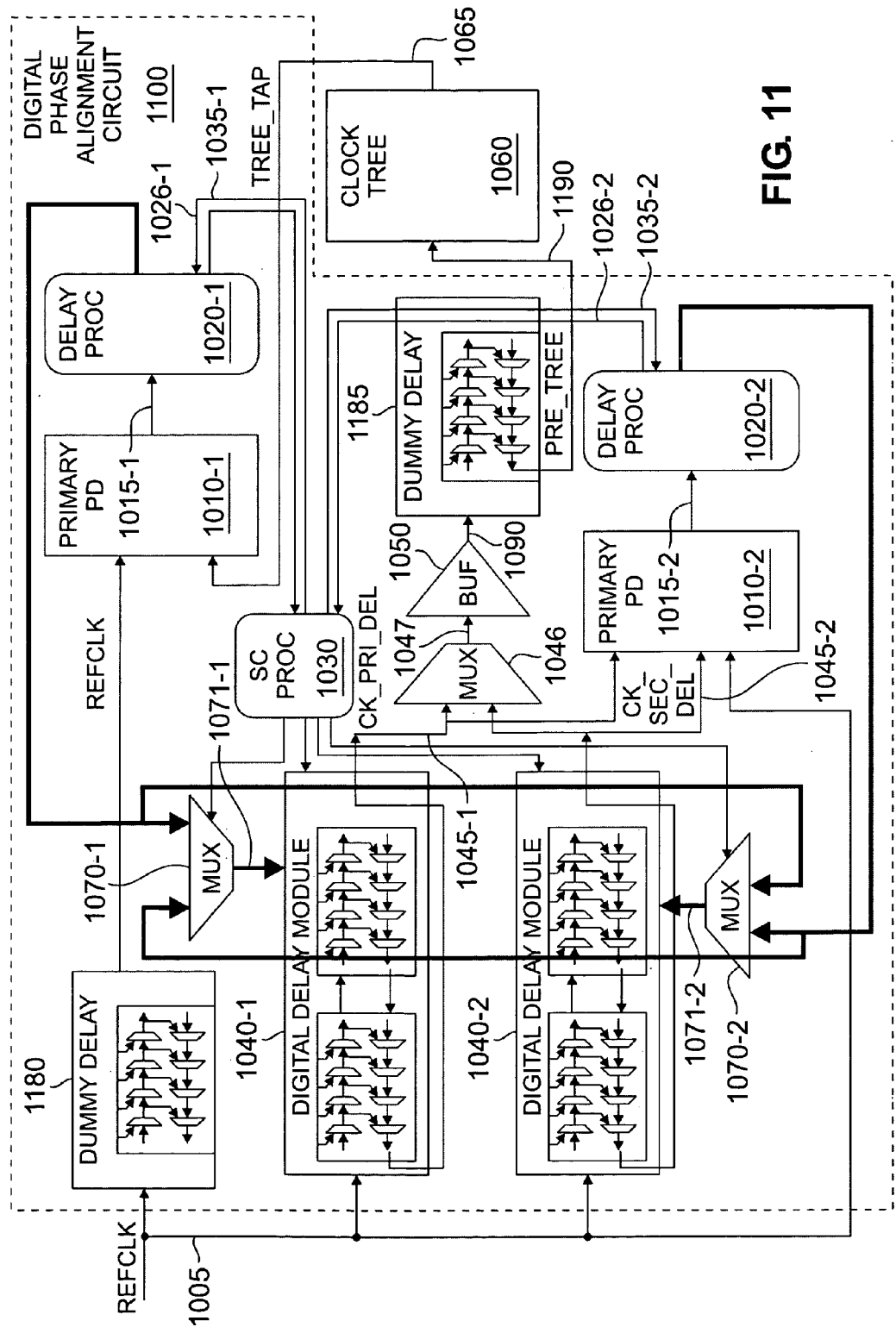
Figure 16:
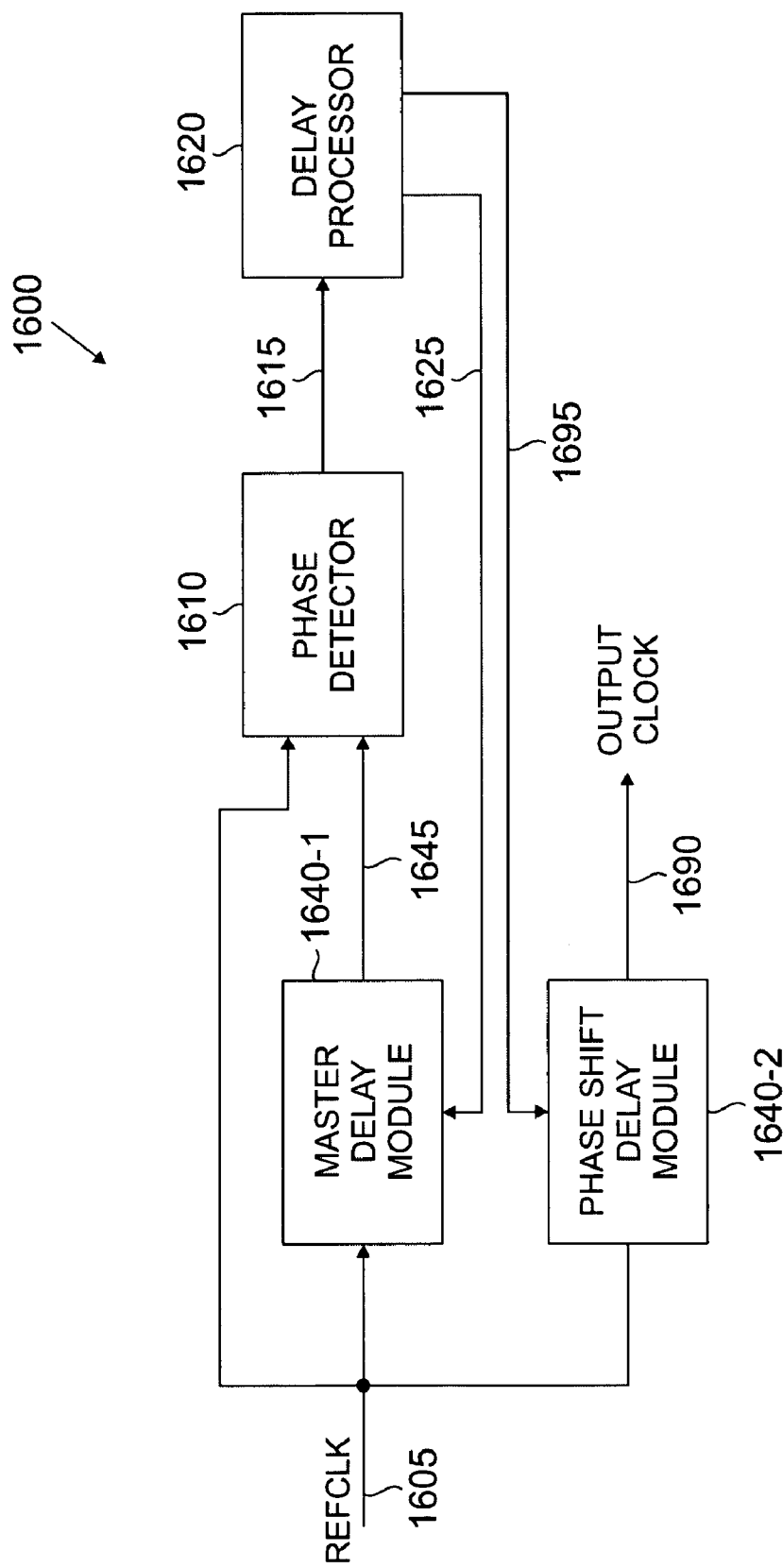
FIG. 16 is a circuit diagram of an exemplary phase shift circuit.

FIGS. 1, 10, and 11 describe a specific type of digital phase shift circuit called a digital phase alignment circuit, while FIG. 16 describes a more general digital phase shift circuit.

Turning now to FIG. 1, a digital phase alignment circuit 100 is shown that is coupled to a clock tree 160 in accordance with an illustrative embodiment of the invention. Typically, the digital phase alignment circuit 100 and the clock tree 160 are formed as portions of an integrated circuit on a semiconductor and placed in one package. However, each of the digital phase alignment circuit 100 and the clock tree 160 could be formed as portions of integrated circuits on separate semiconductors and placed in separate packages. The digital phase alignment circuit 100 is coupleable to a reference clock signal 105, REFCLK, and produces an output clock signal 190, PRE_TREE, which is coupleable to the clock tree 160. The clock tree 160 outputs a tree clock signal 165, TREE_TAP, that corresponds to the output clock signal 190 after the output clock signal 190 has passed through a portion or all of the clock tree 160. The clock tree 160 typically comprises many individual elements (not shown) such as gates, circuits, and logic blocks. The digital phase alignment circuit 100 comprises a phase detector 110, a delay processor 120, a sequence control processor 130, a digital delay module 140, and a buffer 150. The buffer 150 acts to drive the delay module clock output 145 to the clock tree 160 as the output clock signal 190.

The phase detector 110 compares the reference clock signal 105 with the tree clock signal 165 and determines a phase detector output 115 that corresponds to a phase relationship between the reference clock signal 105 and the tree clock signal 165. Two exemplary phase relationships and outputs therefore are explained in more detail below in reference to FIGS. 3 and 4.

Illustratively, the delay processor 120 uses the phase detector output 115 and selects, based at least partially on the phase detector output 115, a value corresponding to a delay. This delay value 122 is communicated, using the delay value bus 125, to the digital delay module 140. As described in more detail below, the delay processor 120 can also perform an integrate and filtering function. The delay processor 120, in an exemplary embodiment, has a programmable filtering parameter 121 (shown as BW in FIG. 1). For instance, the filtering parameter 121 could be a value from one to 16, where a filtering parameter 121 having a value of five means a counter (not shown) in the bandwidth setting 121 will count up or down to five before making a change to the delay value 122. In a conventional PLL, there is a bandwidth parameter that defines how much "bandwidth" a PLL has. Typically, a PLL will only lock to certain frequencies (e.g., in the bandwidth defined by the bandwidth parameter) and frequencies outside of this range are essentially ignored. The filtering parameter 121 can be used to provide a similar function. If the filtering parameter 121 has a low value, then the digital phase alignment circuit 100 will quickly follow any change in position of an edge of the reference clock signal 105. This has the effect of increasing the bandwidth of the digital phase alignment circuit 100. On the other hand, if the filtering parameter 121 has a high value, then the digital phase alignment circuit 100 will slowly follow any change in position of an edge of the reference clock signal 105. This has the effect of decreasing the bandwidth of the digital phase alignment circuit 100.

The sequence control processor 130, in exemplary embodiments, controls certain operations of the delay processor 120 (e.g., through the bus 135) and the digital delay module 140 (e.g., through the bus 136). For instance, on a power up state, the sequence control processor 130 controls the functions of the delay processor 120 in order to determine at what delay values 122 edges occur, as explained in more detail below. Furthermore, the sequence control process controls when a delay value 122 on the delay value bus 125 is used to update a current delay value (not shown) in the digital delay module 140. Additionally, the sequence control processor 130 will set the digital delay module 140 into one of two modes. In an asynchronous mode, the digital delay module 140 will allow large changes to delay values. Meanwhile in the synchronous mode, only small changes to a delay value are allowed. Typically, only one bit changes are allowed in synchronous mode. Allowing only small changes prevents glitches or other noise from occurring on the output clock signal 190.

The term "processor" is intended to encompass any device or set of devices able to perform one, several or all of the functions described herein. For instance, a processor could be a set of logic gates specifically implemented and adapted to perform one, several or all of the functions described herein. Similarly, a processor could be a general purpose microprocessor that is programmed through one or more instructions to cause the general purpose microprocessor to perform one, several or all of the functions described herein.

The digital delay module 140 is a programmable device that uses the delay value 122 and changes the delay associated with the reference clock signal 105 to create a clock signal illustratively called the delay module clock output 145, CK_PRI_DEL. In the example of FIG. 1, the digital delay module 140 comprises a plurality of multiplexers configurable to cause the reference clock signal 105 to be delayed by a delay corresponding to the delay value 122. An example of a digital delay module 140 is shown in FIGS. 12–15. The digital delay module 140 will have a minimum delay (e.g., equivalent to a delay value 122 of zero), a maximum delay (e.g., equivalent to the largest value of the delay value 122), and a range of delays between the minimum delay and maximum delay. Typically, the digital delay module 140 is adapted so that the range of delay is linear with respect to the range of the delay values 122. Generally, the digital delay module 140 is designed so that the range of delay is about three times the period of the reference clock signal 105. For instance, if the reference clock signal 105 has a frequency of one gigahertz (GHz), the period is one nanosecond (ns). It is recommended that the range of delay (e.g., see delay range 210 of FIG. 2 below) for the digital delay module 140 be about three nanoseconds, as this will allow alignment to two to three rising clock edges in the three nanosecond range.

In another exemplary embodiment, the clock tree 160 is not used. Instead, the output clock signal 190 and the tree clock signal 165 are the same clock signal, and this clock signal is communicated to devices external to the digital phase alignment circuit 100. This embodiment allows, for instance, a large range of phase shifts as described in reference to FIG. 16 below.

Figure 2:
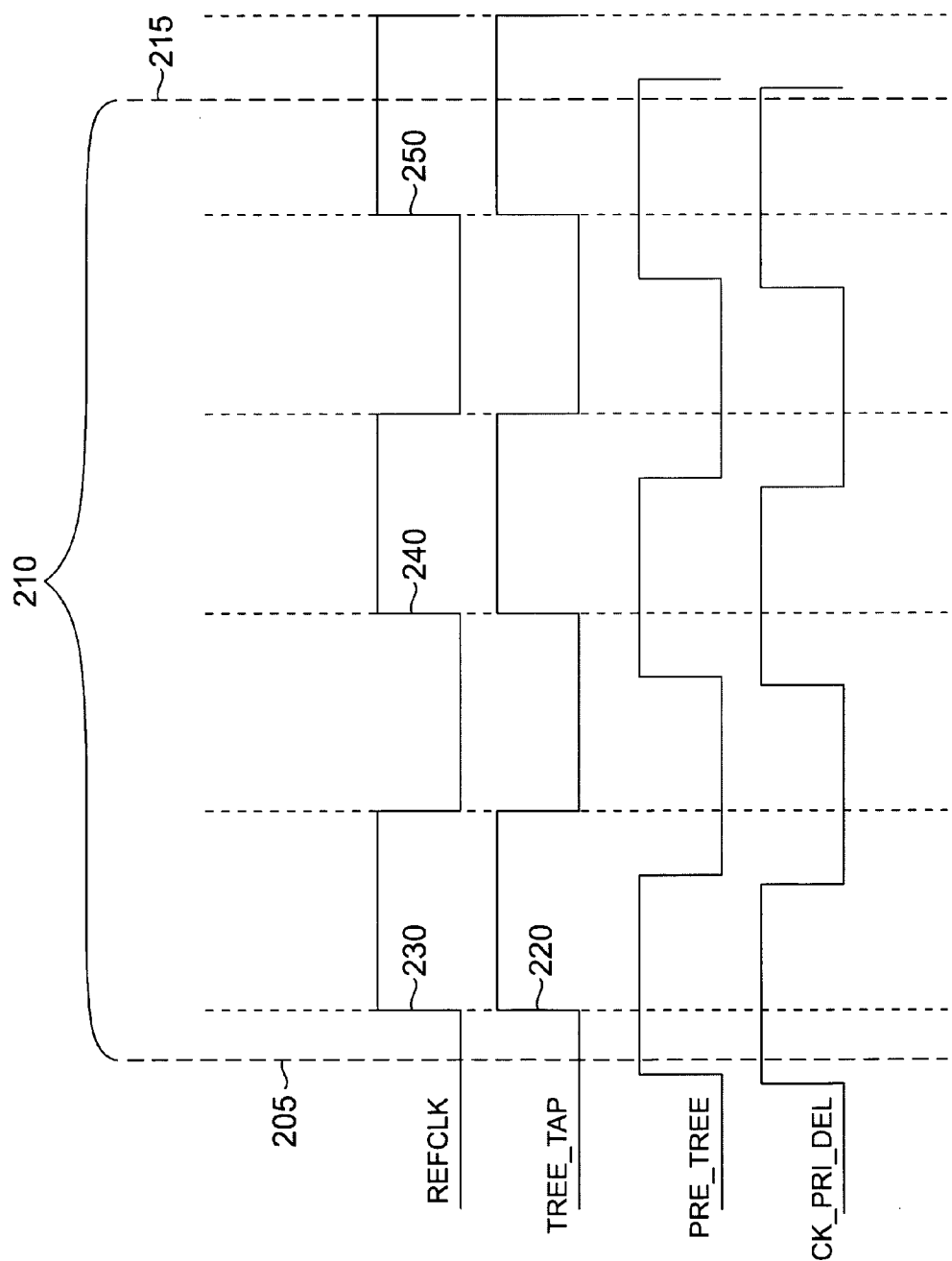
FIG. 2 is an exemplary timing diagram illustrating an operation of the digital phase alignment circuit of FIG. 1.

FIG. 2 is an exemplary timing diagram illustrating an operation of the digital phase alignment circuit of FIG. 1. In the example of FIG. 2, the reference clock signal 105, REFCLK, and tree clock signal 165, TREE_TAP, have been aligned by the digital phase alignment circuit 100. The digital delay module 140 changes a delay on the reference clock signal 105 to create the delay module clock output 145, CK_PRI_DEL, which passes through the buffer 150 to become the output clock signal 190, PRE_TREE. The output clock signal 190 becomes, after passing through some or all of the tree clock signal 165, the tree clock signal 165, TREE_TAP. By adjusting the delay of the reference clock signal 105 using the digital delay module 140 and appropriate delay values 122, the digital phase alignment circuit 100 can adjust the first positive edge 220 of the tree clock signal 165 anywhere in the delay range 210 (as an example), where reference 205 indicates a zero delay (e.g., corresponding to a delay value 122 of zero) and reference 215 indicates a maximum delay (e.g., corresponding to a delay value 122 of a maximum value).

In this example, the first positive edge 220 can be aligned with the positive edges 230, 240, and 250. However, it is beneficial to align the first positive edge 220 with the positive edge 240, as this provides a wider range of delay around the positive edge 240 to account for clock drift. It should be noted that delay values 122 can also be used so that the first positive edge 220 is not aligned with any of the positive edges 230, 240, and 250 and is, for instance, out of alignment from the positive edge 230 by half a period.

Typically, the delay value 122 (e.g., and the delay value bus 125) will be a certain number of bits, such as 16 bits. An example given below uses 34 bits. As described herein, a low value of the delay value 122 corresponds to a small delay in the delay range 210 and a high value of the delay value 122 corresponds to a large delay in the delay range 210. However, a low value of the delay value 122 could correspond to a large delay in the delay range 210, if desired. Additionally, delays associated with delay values 122 are assumed to be linear (e.g., a delay value 122 of X is assumed to cause a delay of Y in the delay range 210, and a delay value 122 of 2X is assumed to cause a delay of 2Y in the delay range 210), but delays associated with delay values 122 may be non-linear.

Figure 3:
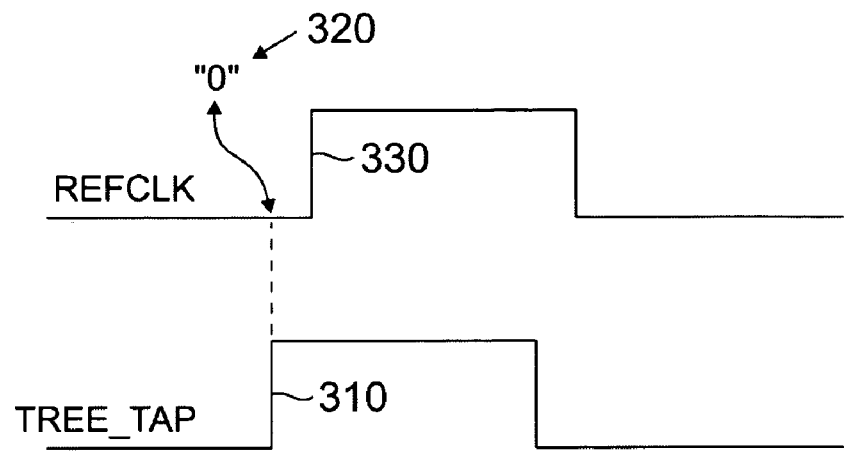
FIGS. 3 and 4 are exemplary timing diagrams illustrating how an output of a phase detector is determined in exemplary embodiments.
Figure 4:
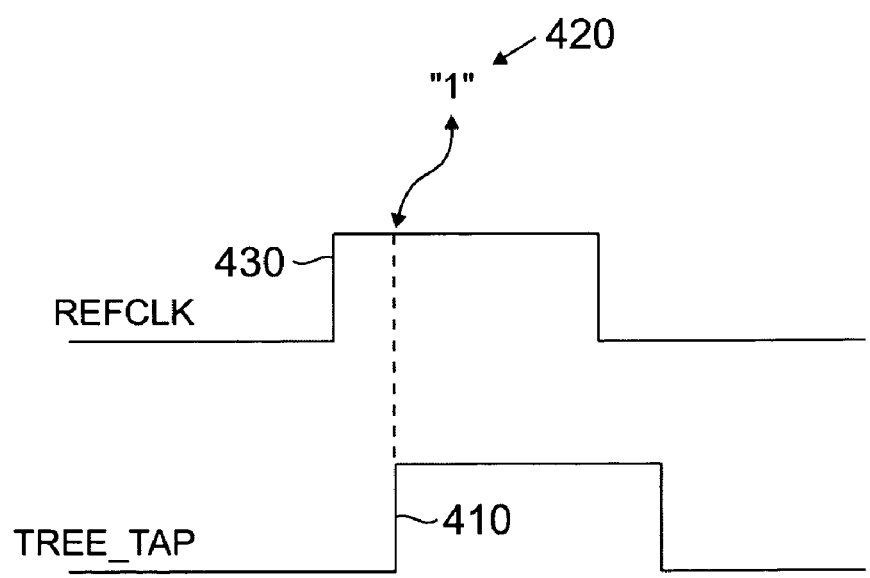

FIGS. 3 and 4 are timing diagrams illustrating how the phase detector output 115 is determined in an exemplary embodiment. The phase detector 110 is a positive edge phase detector, in that the phase detector 110 latches in the value of the reference clock signal 105 on the positive (i.e., rising) edge of the tree clock signal 165. A negative edge phase detector 110 may also be used. Illustratively, the phase detector 110 can be one or more D flip flops and acts, in the exemplary embodiment described in FIGS. 3 and 4, like a single D flip flop. In the example of FIG. 3, when the positive edge 310 occurs, the phase detector 110 latches in a zero value 320 that is the phase detector output 115. In FIG. 3, more delay when creating the tree clock signal 165 is necessary to align the tree clock signal 165 with the reference clock signal 105. In FIG. 4, when the positive edge 410 occurs, the phase detector 110 latches in a one value 420 that is the phase detector output 115. In FIG. 4, less delay when creating the tree clock signal 165 is necessary to align the tree clock signal 165 with the reference clock signal 105.

Thus, the phase detector 110 produces a phase detector output 115 that corresponds to a phase relationship between the reference clock signal 105 and the tree clock signal 165. When the phase detector output 115 is zero, the positive edge 310 is "behind" the positive edge 330, and the two positive edges 310 and 330 can be aligned by adding delay to the reference clock signal 105 by the digital delay module 140. In FIG. 3, the tree clock signal 165 can be considered to have a negative phase relationship (e.g., a negative phase shift) relative to the reference clock signal 105. Conversely, when the phase detector output 115 is zero, the positive edge 410 is "ahead" of the positive edge 430, and the two positive edges 410 and 430 can be aligned by subtracting delay to the reference clock signal 105 by the digital delay module 140. In FIG. 4, the tree clock signal 165 can be considered to have a positive phase relationship (e.g., a positive phase shift) relative to the reference clock signal 105.

Figure 5:
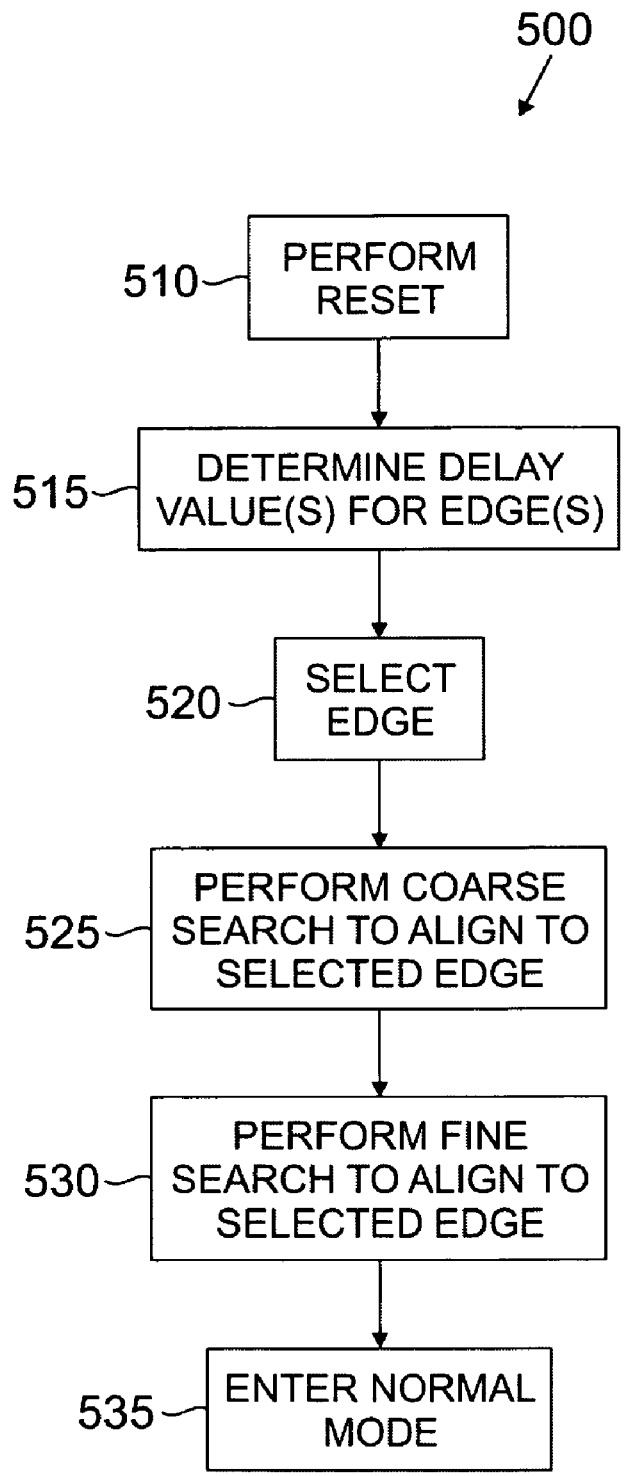
FIG. 5 is a flow chart of a method performed by the digital phase alignment circuit of FIG. 1 during a startup operation.

Referring now to FIG. 5, an exemplary method 500, performed by the digital phase alignment circuit of FIG. 1 during a startup operation, is shown. Method 500 is used during startup to select an edge of the reference clock signal 105 with which the tree clock signal 165 will be aligned. Method 500 begins in step 510, when a reset is performed. Typically, the sequence control processor 130 will reset the phase detector 110, delay processor 120, and digital delay module 140. Additionally, the sequence control processor 130 will cause the delay processor 120 to load a startup delay value 122 into the digital delay module 140 and to place the digital delay module 140 in an asynchronous mode (e.g., large changes in delay values 122 are allowed).

In step 515, delay values 122 are determined that correspond to edges of the reference clock signal 105 that lie within the delay range 210. There are a number of techniques that can be used in this step. For example, the delay value 122 can be set to a value corresponding to a middle delay in the delay range 210. Then search techniques can be used to find an edge (e.g., a positive edge) near the delay value 122 corresponding to the middle delay. This has an advantage in that an edge can be found relatively quickly, and an exemplary embodiment using this technique is described in more detail below. As another example, which is the example described in more detail below in reference to FIG. 6, a search from the minimum delay (e.g., corresponding to a minimum delay value 122) to the maximum delay (e.g., corresponding to a maximum delay value 122) is performed to category the edges of the reference clock signal 105 in the delay range 210.

Although delay values 122 corresponding to positive edges of the reference clock signal 105 are determined herein, delay values 122 corresponding to negative edges of the reference clock signal 105 may also be determined. For example, by aligning a positive edge of the tree clock signal 165 with a negative edge of the reference clock signal 105, the tree clock signal 165 will be delayed by half a period of the reference clock signal 105. Additionally, a duty cycle of the reference clock signal 105 can be examined. Furthermore, a Unit Interval (UI) can be determined, as described in more detail below.

In step 520, an edge of the reference clock signal 105 is selected (e.g., by selecting a delay value 122 corresponding to the edge of the reference clock signal 105). Typically, the selected edge is the edge having a delay closest to a middle delay value 122, as this allows a wider range of delay values 122 to be used should the reference clock signal 105 drift. However, any edge may be used.

In step 525, a coarse search is performed to align an edge of the tree clock signal 165 with the selected edge of the reference clock signal 105. Step 525 is described in more detail in reference to FIG. 7. Step 530 performs a fine search to align an edge of the tree clock signal 165 with the selected edge of the reference clock signal 105. An example of step 530 is described in more detail in reference to FIG. 8.

Once an edge of the tree clock signal 165 has been aligned with the selected edge of the reference clock signal 105, then normal mode is entered in step 535. An example of step 535 is described below in reference to FIG. 9.

Figure 6:
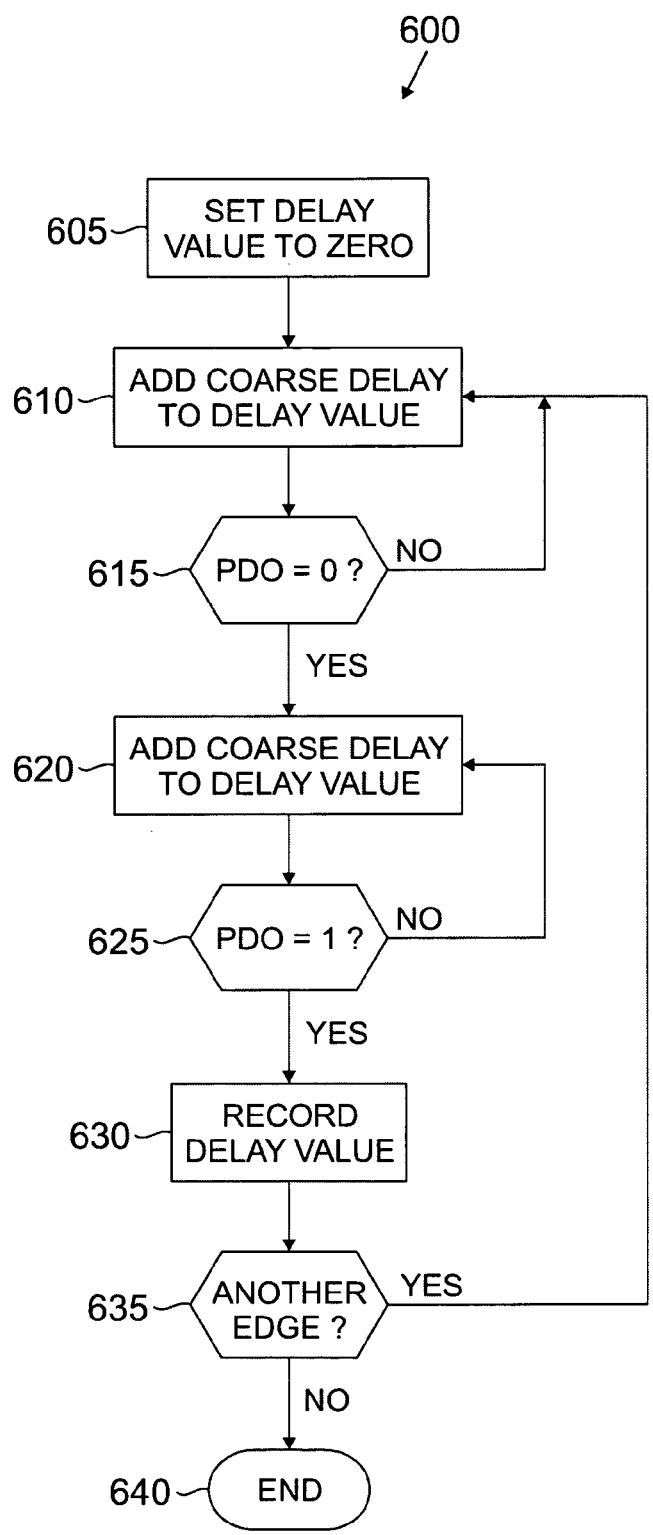
FIG. 6 is a flow chart of a method performed by the digital phase alignment circuit of FIG. 1 to determine delay values for a number of edges of a reference clock signal to which a tree clock signal can be aligned.

Turning now to FIG. 6, a method 600 is shown that is performed by the digital phase alignment circuit of FIG. 1 to determine delay values for a number of edges of the reference clock signal 105 to which the tree clock signal 165 can be aligned. Method 600 is an example of step 515 of FIG. 5, and the method 600 searches for positive edges of the reference clock signal 105. Method 600 begins in step 605, when the delay value 122 is set to zero and communicated by the delay processor 120 to the digital delay module 140. In step 610, a coarse delay is added to the delay value 122 and the new resultant delay value 122 is communicated to the digital delay module 140 by the delay processor 120. The coarse delay is a value for the delay value 122 that is relatively large, for instance, five or ten percent of the maximum possible delay value 122. In step 615, it is determined if the phase detector output 115 is zero. If not (step 615=NO), then step 610 is performed again. If so (step 615=YES), then step 620 is performed. Just prior to step 620, the phase relationship between the reference clock signal 105 and tree clock signal 165 should be as shown in FIG. 3. Thus, steps 610 and 615 place the tree clock signal 165 so that a positive edge of the tree clock signal 165 occurs "before" a positive edge of the reference clock signal 105.

In step 620, the coarse delay is again added to the delay value 122 and communicated by the delay processor 120 to the digital delay module 140. In step 625, it is determined if the phase detector output 115 is one. If the phase detector output 115 is not one (step 625=NO), then step 620 is performed again. If the phase detector output 115 is one (step 625=YES), then a positive edge of the reference clock signal 105 has been found. Steps 620 and 625 place the tree clock signal 165 so that the phase relationship between the reference clock signal 105 and tree clock signal 165 should be as shown in FIG. 4. Thus, steps 620 and 625 place the tree clock signal 165 so that a positive edge of the tree clock signal 165 occurs "after" a positive edge of the reference clock signal 105. In step 630, the delay value 122 corresponding to the edge of the reference clock signal 105 is recorded.

Step 635 determines if another edge is to be found. Typically, the entire delay range 210 will be examined by advancing the delay value 122 from a minimum value to a maximum value. However, in another exemplary embodiment, the method 600 can be modified so that a delay value 122 is used that is about half of the maximum delay value, and a single delay value 122 corresponding to an edge in the reference clock signal 105 at about the middle of the delay range 210 will be found and recorded. If another edge is to be found (step 635=YES), then the method 600 continues at step 610. If not (step 635=NO), the method 600 ends in step 640.

Figure 7:
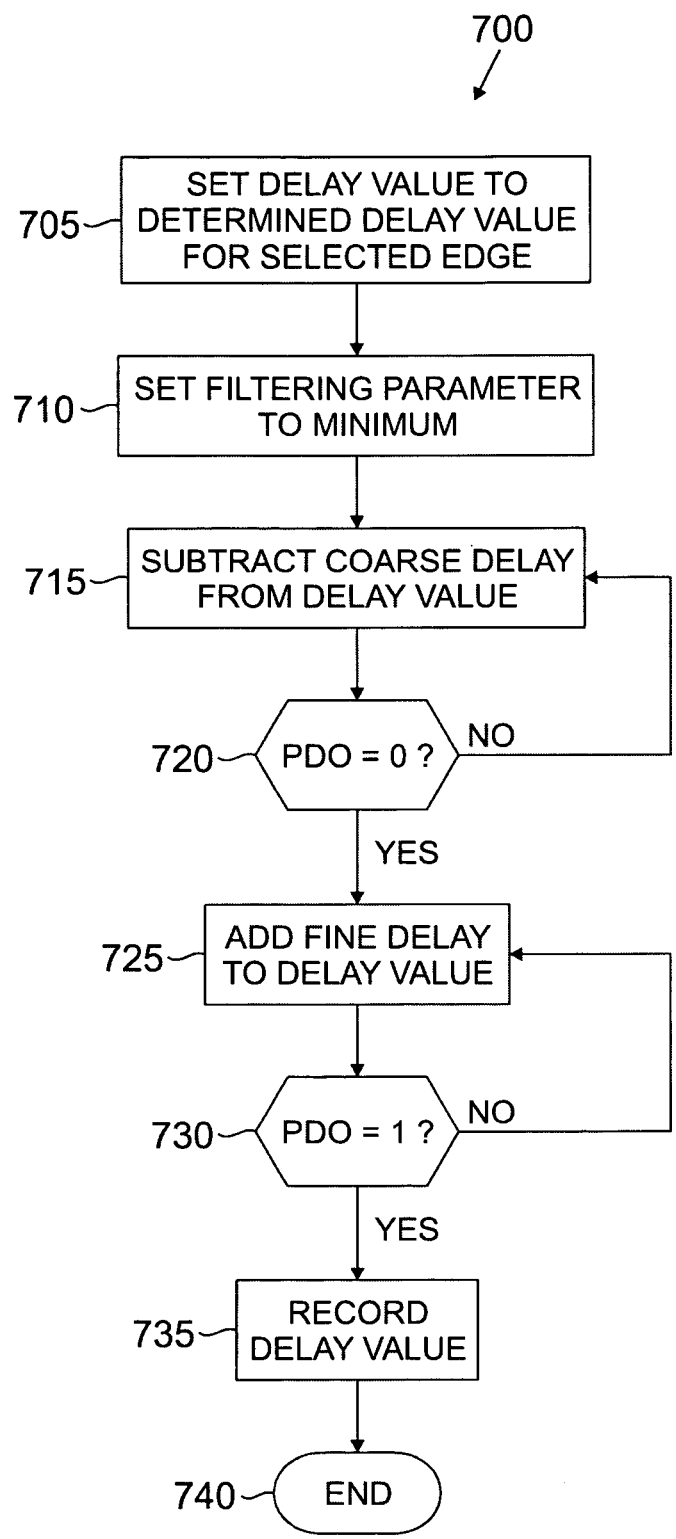
FIG. 7 is a flow chart of a method performed by the digital phase alignment circuit of FIG. 1 for performing a coarse search to align a tree clock signal to a selected edge of a reference clock signal.

Once the edges of the reference clock signal 105 in the delay range 210 have been determined, then an edge is selected by selecting a corresponding delay value 122 (e.g., step 520 of FIG. 5). Typically, the delay value 122 nearest the middle value of the possible delay values 122 (e.g., the maximum delay value 122 divided by two) is chosen. This selection allows a larger range of delay values 122 to allow alignment with the reference clock signal 105 if the reference clock signal 105 drifts. In FIG. 7, a coarse search is performed to align a tree clock signal to a selected edge of a reference clock signal. Before proceeding with a description of FIG. 7, additional examples of the methods of FIGS. 5 and 6 will be described.

Returning to FIG. 5, in step 515, delay values are determined for each edge in the delay range 210. In step 520, one of the edges is selected by selecting a corresponding delay value. This method is useful because all edges (including both positive and negative edges if desired) can be determined and one of the edges selected. This technique can be slow, however, because it takes a while to determine the different edges in the delay range 210.

Consequently, method 500 could be changed so that steps 515 and 520 are combined and a single edge, an edge closest to the middle of the delay range 210, is quickly found and selected. Steps 510 and 525 through 535 could remain the same. A combined step to replace steps 515 and 520 could perform the following steps (e.g., as method 600):

1. Set the delay value 122 to a middle delay value (e.g., a delay value that is equivalent to the maximum delay value divided by two).
2. Is the phase detector output 115 zero?
3. If the phase detector output 115 is zero, add coarse delay values until the phase detector output 115 is one. Record this delay value as the delay value for the selected edge.
4. If the phase detector output 115 is not zero, subtract coarse delay values until the phase detector output 115 is zero. The delay value 122 corresponding to the last phase detector output 115 of one is recorded as the delay value for the selected edge.

Thus, an edge near the middle of the delay processor 120 can be quickly found and selected. This can provide faster time to select an edge, should a faster time be desired.

Turning now to FIG. 7, a method 700 is shown that is performed by the digital phase alignment circuit of FIG. 1 and that performs a coarse search to align a tree clock signal to a selected edge of the reference clock signal 105. Method 700 is generally performed by the delay processor 120. Method 700 performs a coarse search for the selected edge (e.g., step 525 of FIG. 5).

Method 700 begins in step 705 when the delay value 122 is set to the determined delay value for the selected edge. The delay value 122 is also communicated by the delay processor 120 to the digital delay module 140. In step 710, the filtering parameter 121 is set to minimum. The filtering parameter 121, as described above, may be used to modify the bandwidth of the digital phase alignment circuit 100. This is explained in additional detail below in reference to FIG. 9. In an exemplary embodiment, the filtering parameter 121 can be set from one to sixteen, so the value of one is chosen in step 710.

In step 715, the a coarse delay is subtracted from the determined delay value and the new value is placed into the delay value 122 and is communicated to the digital delay module 140. If the phase detector output 115 is zero in step 720, then step 715 is performed again. If the phase detector output 115 is not zero, then step 725 is performed. Steps 715 and 720 create a phase relationship between the reference clock signal 105 and tree clock signal 165 as shown in FIG. 3. Thus, steps 715 and 720 place the tree clock signal 165 so that a positive edge of the tree clock signal 165 occurs before a positive edge of the reference clock signal 105.

Once the phase relationship between the reference clock signal 105 and tree clock signal 165 is as shown in FIG. 3, then a delay value 122 that causes closer alignment between the reference clock signal 105 and tree clock signal 165 can be determined. Steps 725 and 730 find the delay value 122 that causes the closer alignment. In step 725, a fine delay is added to the current delay value 122. In step 730, it is determined if the phase detector output 115 is one, which indicates that the phase relationship between the reference clock signal 105 and the tree clock signal 165 is as shown in FIG. 4. If the phase detector output 115 is not 1 (step 730=NO), then step 725 is performed again. If the phase detector output 115 is one (step 730=YES), then the final delay value 122 is recorded as a delay value 122 that causes closer alignment between the reference clock signal 105 and tree clock signal 165. Method 700 ends in step 740.

Figure 8:
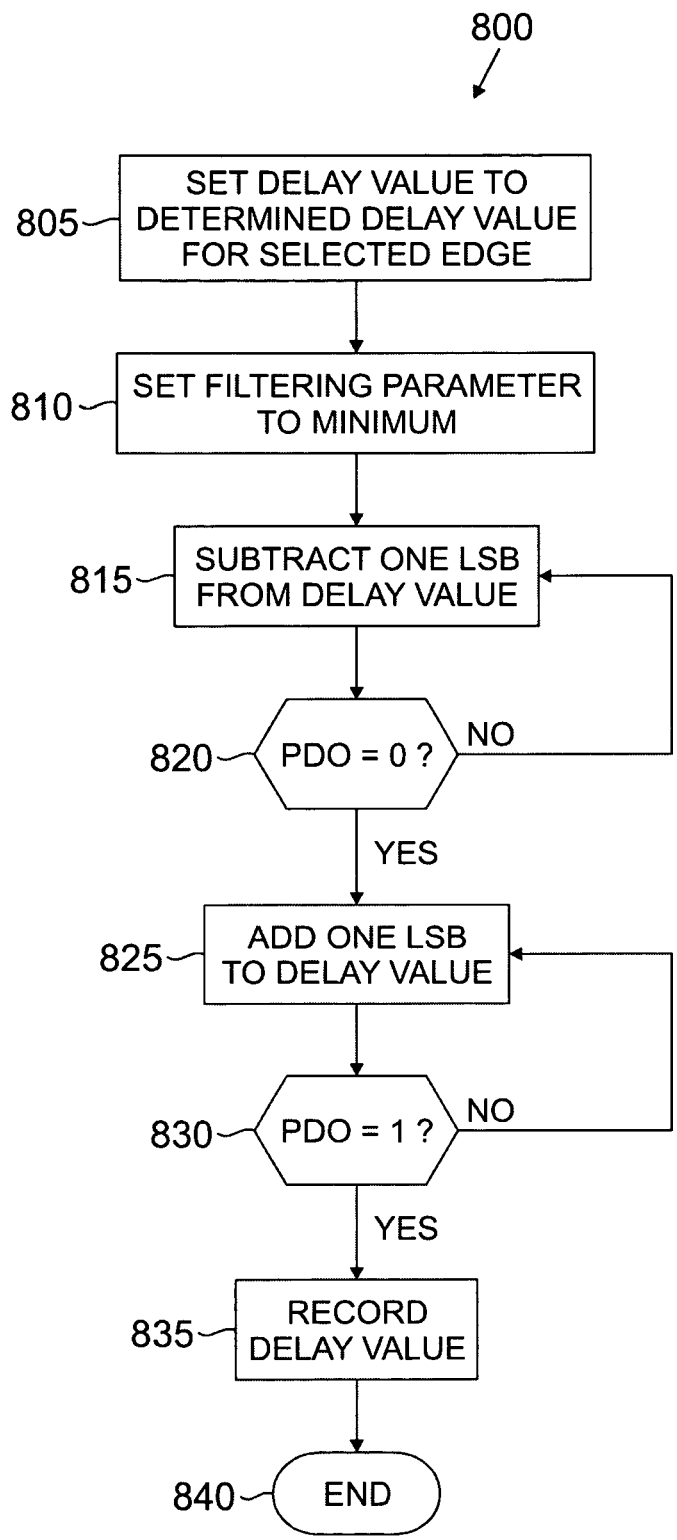
FIG. 8 is a flow chart of a method performed by the digital phase alignment circuit of FIG. 1 to perform a fine search to align a tree clock signal to a selected edge of a reference clock signal.

Referring now to FIG. 8, a method 800 is shown that is performed by the digital phase alignment circuit of FIG. 1 and that performs a fine search to align the tree clock signal 165 to the selected edge of the reference clock signal 105 (e.g., step 530 of FIG. 5). After method 700, the currently recorded delay value 122 is a value such that the phase relationship between the reference clock signal 105 and tree clock signal 165 as shown in FIG. 4. Method 800 uses very small values subtracted from and added to the delay value 122 until the currently recorded delay value 122 is a value such that there is a very close alignment between the reference clock signal 105 and tree clock signal 165.

Method 800 begins in step 805, when the delay value 122 is modified to the delay value determined in step 735 of FIG. 7. In step 810, the filtering parameter 121 is set to a minimum value, although the filtering parameter 121 can be set to a desired value. The filtering parameter 121 is described in more detail in reference to FIG. 9.

In step 815, one Least Significant Bit (LSB) is subtracted from the delay value 122. In the example of FIG. 8, an LSB corresponds to a delay value that yields the smallest increment of delay for the tree clock signal 165. Additionally, FIG. 8 assumes that smaller values of delay values 122 decrease the delay and larger values of delay values 122 increase the delay. However, other implementations are possible. In step 820, it is determined if the phase detector output 115 is zero. If the phase detector output 115 is not zero (step 820=NO), method 800 continues in step 815. If the phase detector output 115 is zero (step 820=YES), method 800 continues in step 825. Steps 815 and 820 create a phase relationship between the reference clock signal 105 and tree clock signal 165 as shown in FIG. 3. Therefore, steps 815 and 820 place the tree clock signal 165 so that a positive edge of the tree clock signal 165 occurs before a positive edge of the reference clock signal 105.

In step 825, one LSB is added to the delay value 122. In step 830, it is determined if the phase detector output 115 is one. If the phase detector output 115 is not one (step 830=NO), method 800 continues in step 825. If the phase detector output 115 is one (step 820=YES), method 800 continues in step 825. Steps 825 and 830 create a phase relationship between the reference clock signal 105 and tree clock signal 165 as shown in FIG. 4. Consequently, steps 825 and 830 place the tree clock signal 165 so that a positive edge of the tree clock signal 165 occurs after a positive edge of the reference clock signal 105.

In step 835, the delay value 122 is recorded. The recorded delay value 122 should cause a very close alignment between the reference clock signal 105 and tree clock signal 165. In step 840, method 800 ends.

Figure 9:
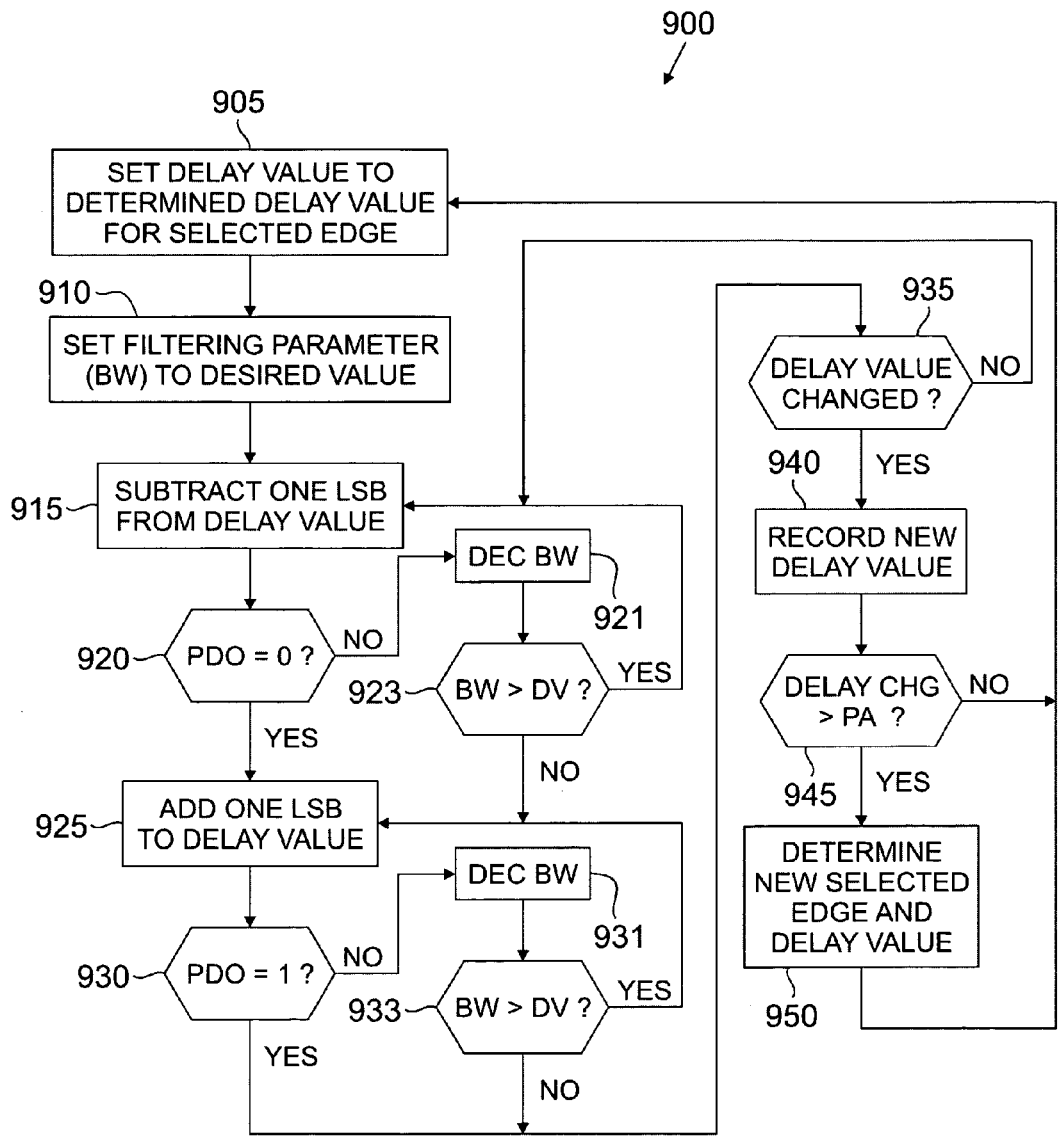
FIG. 9 is a flow chart of a method performed by the digital phase alignment circuit of FIG. 1 during a normal mode of operation.

Turning now to FIG. 9, a method 900 is shown that is performed by the digital phase alignment circuit 100 of FIG. 1 during a normal mode of operation. In the normal mode of operation, the digital phase alignment circuit 100 attempts to maintain the very close alignment between the reference clock signal 105 and tree clock signal 165 determined by the methods shown in FIGS. 5 to 8. Method 900 starts in step 905, when the delay value 122 in the delay processor 120 is set to the delay value determined in step 835 of method 800 of FIG. 8 and is communicated by the delay processor 120 to the digital delay module 140. Additionally, the sequence control processor 130 places the digital delay module 140 into synchronous mode, so that only small changes in the delay value 122 are allowed (e.g., changes in a single LSB of the delay value 122 are allowed).

In step 910, the filtering parameter 121 is set to the desired value. In an exemplary embodiment, the filtering parameter 121 has 16 values, from 1 to 16. A setting of five, for instance, means that a counter (not shown) will count up or down to five before making one LSB change to the delay value 122. Lower values for the filtering parameter 121 provide less filtering and therefore a higher bandwidth, while higher values provide more filtering and therefore a lower bandwidth for the digital phase alignment circuit 100. Note that even relatively large values of the filtering parameter 121 allow jitter or noise to pass. Jitter is defined, for instance, as short-term variations of significant instants (e.g., particular edges) of a digital signal from their ideal positions in time. Noise is any other deviation of the clock signal from ideal. A glitch is one type of noise. Larger values of the filtering parameter 121 therefore act to slow reaction to clock drift. Clock drift is defined, e.g., as a movement of the clock signal (e.g., both positive and negative edges move).

Once the reference clock signal 105 and the tree clock signal 165 are aligned, a one LSB subtraction to the delay value 122 should give a zero reading on the phase detector output 115, when the delay value 122 is set to the delay value found in step 835 of FIG. 8. If subtracting a LSB from the delay value 122 does not give a zero reading on the phase detector output 115, then it may be that the reference clock signal 105 has drifted or has some amount of clock jitter and the method 900 can attempt to realign the reference clock signal 105 and the tree clock signal 165.

In step 915, one LSB is subtracted from the delay value 122 and the resultant delay value is loaded to the digital delay module 140. Note that another option is to send a signal to the digital delay module 140 to decrease its current delay value by one. If the phase detector output 115 is not zero (step 920=NO), then the filtering parameter 121 is decremented in step 921. If the filtering parameter 121 is larger than the desired value (step 921=YES), then another LSB is subtracted from the delay value. If the filtering parameter is not larger than the desired value (step 921=NO), then the method continues in step 925. If the phase detector output 115 is zero (step 920=YES), method 900 continues in step 925.

In step 925, one LSB is added to the delay value 122 and the resultant delay value is loaded to the digital delay module 140. If the phase detector output 115 is not one (step 930=NO), then the filtering parameter 121 is decremented in step 931. In step 933, it is determined if the filtering parameter 121 is greater than the desired value. If so (step 933=YES), then another LSB is added to the delay value 122 and the resultant delay value is loaded to the digital delay module 140 as step 925 is performed again. If the filtering parameter 121 is not greater than the desired value (step 933=NO) or the phase detector output 115 is one (step 930=YES), method 900 continues in step 935.

If there is no jitter or clock drift, steps 915, 920, 925, and 930 should keep the reference clock signal 105 and the tree clock signal 165 aligned. The filtering parameter 121 is used to slow reaction to the changing reference clock signal 105. The delay value 122 will not be changed until the filtering parameter 121 exceeds the desired value. Larger values of the filtering parameter 121 therefore tend to decrease bandwidth and also slow reaction to jitter or clock drift.

In step 935, it is determined if the delay value has changed from the initial delay value set in step 905. If not (step 935=NO), then method 900 continues in step 915 in order to continue aligning the reference clock signal 105 to the tree clock signal 165. In the delay value has changed from the initial delay set in step 905 (step 935=YES), the new delay value 122 is recorded in step 940. If the delay value 122 has changed a Predetermined Amount (PA) from the initial delay set in step 905 (step 945=YES), in step 950 a new selected edge is determined as is a corresponding new delay value. Otherwise (step 945=NO), the method 900 continues in step 905. Step 950 allows a new edge (which could be the same edge to which the reference clock signal 105 and tree clock signal 165 are currently aligned) to be selected when the reference clock signal 105 has drifted a predetermined amount, such as one-quarter of the maximum delay provided by the digital delay module 140. After step 950, method 900 continues in step 905.

Regarding the filtering parameter 121, the filtering parameter 121 can reset after some number of cycles (e.g., steps 915–950 of FIG. 9) or the filtering parameter 121 can be allowed to remain whatever value it is. Because the filtering parameter 121 can be decremented (step 921) and incremented (step 931), the filtering parameter should naturally change value over time and may not need to be reset.

Referring now to FIG. 10, another exemplary digital phase alignment circuit 1000 is shown. The digital phase alignment circuit 1000 is shown coupled to a clock tree 1060 in accordance with an illustrative embodiment of the invention. The digital phase alignment circuit 1000 is coupleable to reference clock signal 1005, REFCLK, and produces an output clock signal 1090, PRE_TREE, which is coupleable to the clock tree 1060. The clock tree 1060 outputs a tree clock signal 1065, TREE_TAP, that corresponds to the output clock signal 1090 after the output clock signal 1090 has passed through a portion or all of the clock tree 1060. The digital phase alignment circuit 1000 comprises phase detectors 1010-1 and 1010-2, a delay processor 1020, sequence control processors 1030-1 and 1030-2, digital delay modules 1040-1 and 1040-2, a buffer 1050, and multiplexers 1070-1, 1070-2, and 1046. The buffer 1050 acts to drive the output 1047 of the multiplexer 1046 to the clock tree 1060 as the output clock signal 1090. Each delay processor 1020 comprises a delay value 1022 and a filtering parameter 1021.

Each of the digital delay modules 1040 produces a delay module clock output 1045. The multiplexer 1046 selects between the two delay module clock outputs 1045 based on input from the sequence control processor 1030. In an exemplary embodiment, the multiplexer 1046 will select one of the two delay module clock outputs 1045 so that no glitches in the output 1047. For example, one of the delay module clock outputs 1045 can be selected when both the delay module clock outputs 1045 are a stable value, such as both being a low value or both being a high value. If one of the delay module clock outputs 1045 is rising or falling during the selection of a delay module clock output 1045, the output 1047 might have some glitches.

The sequence control processor 1030 and the delay processors 1020 communicate through buses 1026 and 1035. Each phase detector 1010 produces a phase detector output 1015, and each delay processor 1020 communicates a delay value 1022 to a corresponding digital delay module 1040 through a multiplexer 1070 by using a delay value bus 1025. Each multiplexer 1070 selects an appropriate delay value to place on a corresponding MUX output 1071 under direction of the sequence control processor 1030.

The sequence control processor 1030, in a power up mode, controls the functions of the delay processors 1020. The sequence control processor 1030 causes the delay processor 1020-1 to use the "primary" digital delay module 1040 to select an appropriate positive edge of the reference clock signal 1005 to which the tree clock signal 1065 should be aligned. The sequence control processor 1030 also controls the "secondary" delay processor 1020 to identify one Unit Interval (UI). On successful completion of the these two steps, the sequence control processor 1030 enters normal mode, where the sequence control processor 1030 then controls the smooth multiplexings.

When a digital delay module 1040 to a selected delay processor 1020 is not in the signal path, the digital phase alignment circuit 1000 changes the function of the corresponding phase detector 1010 to constantly determine the positive edge placement that is one UI off the delay value being used by the digital delay module 1040 that is in signal path. This is done to ensure that systems with higher than one UI time interval of error can also be accommodated by switching the digital delay modules 1040 glitchlessly through smooth multiplexing of the multiplexer 1046 when the one in signal path is running out of delay values.

For a phase detector 1010, in normal operating mode, the phase detector 1010 performs the same functions as a positive phase detector 110. When not in normal mode, a phase detector 1010 keeps track (e.g., in conjunction with the delay processor 1020) of the previous positive edge if the current delay value is higher than three-quarter of the maximum delay value or a predetermined delay value. If a phase detector 1010 is not in either of the modes, the phase detector 1010 (e.g., in conjunction with the delay processor 1020) is setup to constantly monitor one UI.

During a power up mode, the different positive edges throughout the primary digital delay module 1040-1 can be identified. A search is performed from the smallest delay value to the largest delay value as follows:

1. Start with a zero delay value 1022-1 and record the phase detector output 1015-1 with the filtering parameter 1021-1 set to a one (e.g., a value corresponding to the highest bandwidth).

2. Find, by adding a coarse delay to the delay value 1022-1, the delay value 1022-1 where the phase detector output 1015-1 first turns to zero.

3. Find, by adding a coarse delay to the delay value 1022-1, the delay value 1022-1 where the phase detector output 1015-1 first turns to one. Record this delay value 1022-1, which corresponds to the first positive edge of the reference clock signal 1005 in the delay range for the digital delay module 1040-1 (e.g., see delay range 210 of FIG. 2).

4. Now find, by adding a coarse delay to the delay value 1022-1, the delay value 1022-1 where the phase detector output 1015-1 again turns to zero. Record this delay value 1022-1.

5. Now find the second positive edge by adding a coarse delay to the delay value 1022-1, and determining the delay value 1022-1 where the phase detector output 1015-1 again turns to one. The delay value 1022-1 for the second positive edge is recorded, and the approximate period is determined using the delay values 1022-1 for the first and second positive edges.

6. Knowing the possible approximate delay for the digital delay module 1040-1, determine if there is any need to proceed to determine more positive edges. This can be deduced by having knowledge of the center point delay value (e.g., the maximum delay value divided by two) for the digital delay module 1040- and comparing the center point delay value with the delay values for the first and second positive edges. If the second positive edge is past the center point delay value, typically there is no need to determine delay values associated with additional positive edges.

7. If other positive edges are to be found, find the other positive edges and record the associated delay values 1022-1 for these edges.

8. A positive edge is selected by selecting a delay value near the center point delay value.

As part of the power up mode, it is also beneficial to determine identify what one Unit Interval (UI) is by scanning through the "secondary" digital delay module 1040-2.

1. Start with a zero delay value 1022-2 and record the phase detector output 1015-2 with the filtering parameter 1021-2 set to one (e.g., a value corresponding to the highest bandwidth).

2. Find, by adding a coarse delay to the delay value 1022-2, the delay value 1022-2 where the phase detector output 1015-2 first turns to zero.

3. Find, by adding a coarse delay to the delay value 1022-2, the delay value 1022-2 where the phase detector output 1015-2 first turns to one. Record this delay value 1022-2, which corresponds to the first positive edge of the reference clock signal 1005 in the delay range for the digital delay module 1040-2 (e.g., see delay range 210 of FIG. 2).

4. Now find, by adding a coarse delay to the delay value 1022-2, the delay value 1022-2 where the phase detector output 1015-2 again turns to zero. Record this delay value 1022-2.

5. Now find the second positive edge by adding a coarse delay to the delay value 1022-2, and determining the delay value 1022-2 where the phase detector output 1015-1 again turns to one. The delay value 1022-2 for the second positive edge is recorded, and the approximate period (T) is determined using the delay values 1022-1 for the first and second positive edges. The UI is then determined because one T=one UI.

6. Set the filtering parameter 1021-2 to a desired value, such as seven, and sweep the delay value 1022-2 in fine mode. During the sweep, keep measuring the one T=one UI time. The one T value is to be used to appropriately update an offset based on PVT. This feature is explained in relationship to FIG. 11.

The selected positive edge of the reference clock signal 1005 can be aligned with the tree clock signal 1065 using the digital delay module 1040-1 and the method of FIGS. 7 and 8. A normal mode can also be entered, as in the method of FIG. 9. In the normal mode, the delay processor 1020-2 keeps determining UI measurements by using the digital delay module 1040-2.

Also in normal mode, the delay values 1022-1 for the digital delay module 1040-1 can be monitored to determine if the delay values 1022-1 have been changed by more than, e.g., one-fourth of the maximum delay for the digital delay module 1040-1. If so, the secondary digital delay module 1040-2 can be used to align the reference clock signal 1005 with the tree clock signal 1065 as follows. First, the UI measurements using the secondary digital delay module 1040-2 are frozen and the secondary digital delay module 1040-2 is placed in a mode so that the output 1045-2 of the secondary digital delay module 1040-2 is phase locked with the output 1045-1 of the primary digital delay module 1040-1. It should be noted that "primary" and "secondary" are merely exemplary and the two modules could be reversed. These steps are taken as follows:

1. Freeze the UI value and stop the secondary digital delay module 1040-2 even if the secondary digital delay module 1040-2 is in the middle of making UI measurement. Make sure that UI value is not corrupted.

2. Now select an edge corresponding to smaller or larger delay values than the positive edge currently used by the primary digital delay module 1040-1, as appropriate depending on how the secondary digital delay module 1040-1 has drifted: select an edge corresponding to a smaller delay value if the primary digital delay module 1040-1 has a higher delay value than the initial delay value; and select an edge corresponding to a larger delay value if the primary digital delay module 1040-1 has a smaller delay value than the initial delay value.

3. Establish a phase lock between the output 1045-1 of the primary digital delay module 1040-1 and the output 1045-1 of the secondary digital delay module 1040-2.

4. Maintain the phase lock.

As described above, a switch to the secondary digital delay module 1040-2 can be made once the primary digital delay module 1040-1 has reached one-fourth or three-fourths of the maximum delay value:

1. Freeze the taps of primary and secondary digital delay modules 1040.

2. Switch to the secondary digital delay module 1040.

3. Switch the operation of the primary and secondary digital delay modules 1040. Now the roles for the primary and secondary digital delay modules 1040 have been reversed.

Referring now to FIG. 11, another digital phase alignment circuit 1100 is shown. Digital phase alignment circuit 1100 is the digital phase alignment circuit 1000 but with dummy delay modules 1180 and 1185 added. The dummy delay module 1180 delays the reference clock signal 1005 to produce a delayed reference clock signal 1105. Similarly, the dummy delay module 1185 delays the output clock signal 1190 to create a delayed output clock signal 1190.

Operation of the digital phase alignment circuit 1100 is very similar to the operation of the digital phase alignment circuit 1000. However, the two dummy delay modules 1180 and 1185 insert PVT insensitive offsets. The offsets are updated at slightly different times than the digital delay modules 1140 so that the normal mode is not disturbed. Offset values are to be taken as percentage of the UI. Thus, the UI that is determined during use can be then used to apply the dummy delays 1180 and 1185.

Figure 12:
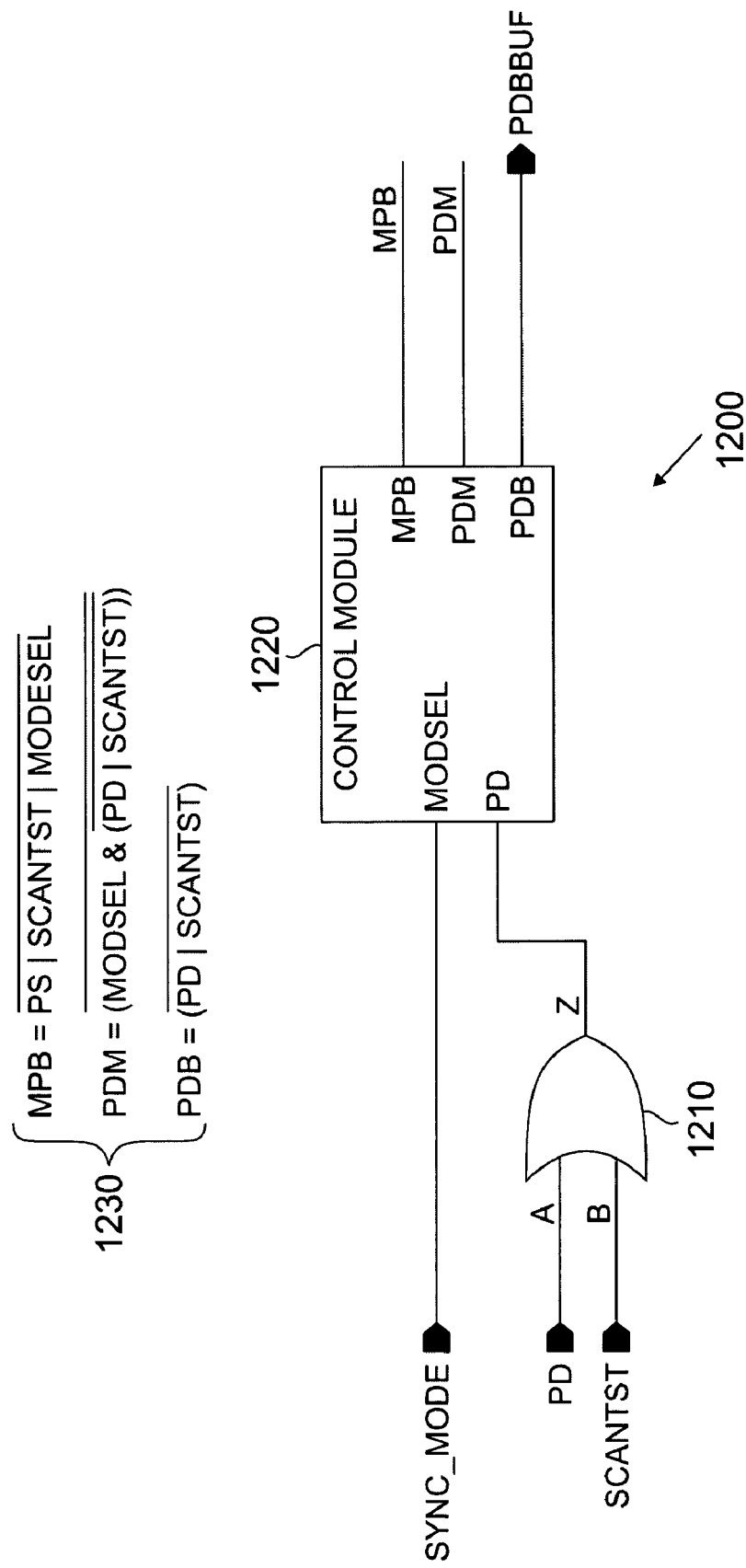
FIG. 12 is a circuit diagram of a control portion of an exemplary digital delay module.

FIGS. 12–15 illustrate portions of an exemplary digital delay module. Referring now to FIG. 12, a control portion 1200 of an exemplary digital delay module is shown. Control portion 1200 comprises a NOR gate 1210 and a control module 1220. The inputs to the control portion 1200 are the signals SYNC_MODE, PD, and SCANTST. The output signal of the control portion 1200 is PDBBUF, and the signals MPB and PDM are internal signals used in other portions of the digital delay module. Control module 1220 performs the logic operations 1230. The SYNC_MODE signal is used to set the digital delay module in synchronous or asynchronous mode. In synchronous mode, only small changes are allowed in the delay value (e.g., defined by COARSE CTL<31:0> and FINE_CTL<1:0> signals shown in FIG. 13). Typically, only changes in the LSB of the FINE_CTL<1:0> signals are allowed. In the asynchronous mode, any change in the delay value is allowed. The signal PD is used for a power down mode, and SCANTST is used for testing.

Figure 13:
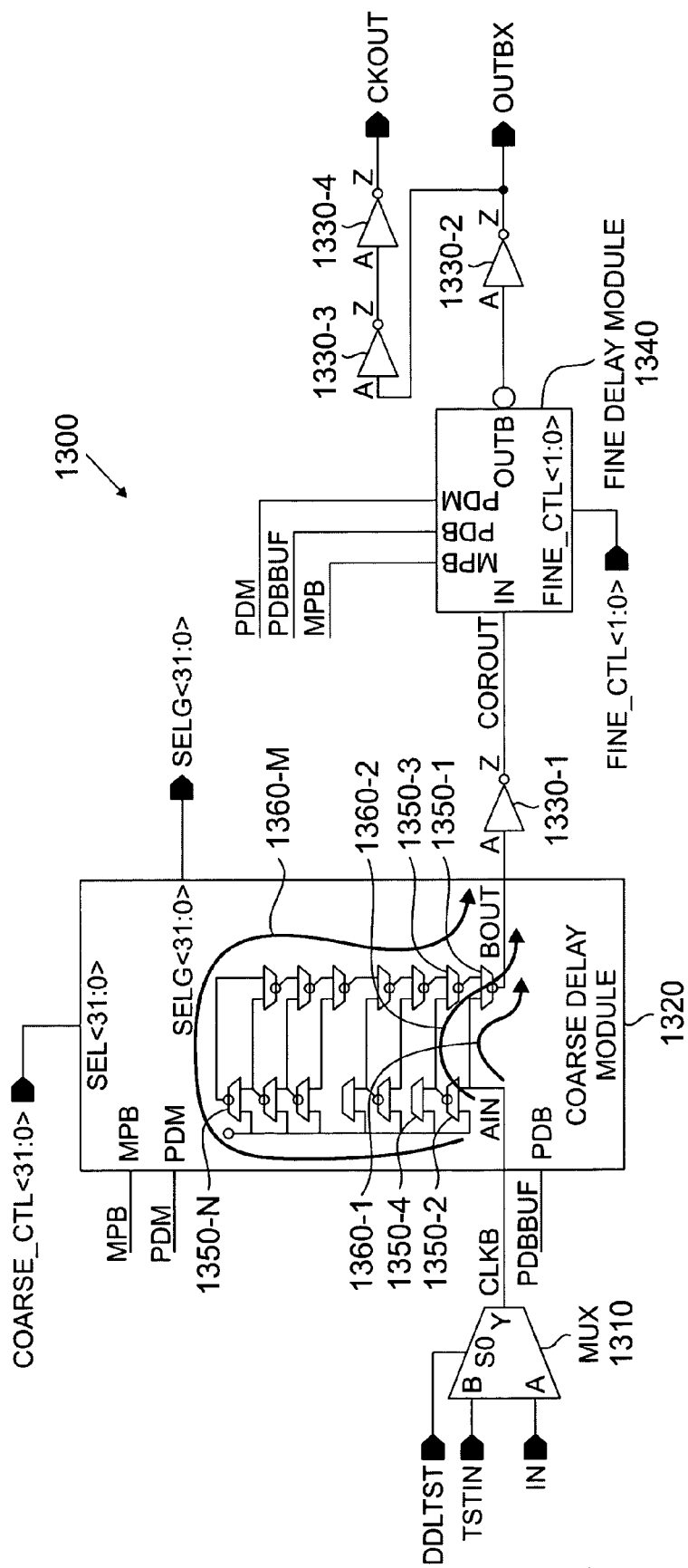
FIG. 13 is a circuit diagram of a delay portion of an exemplary digital delay module.

FIG. 13 is a circuit diagram of a delay portion 1300 of an exemplary digital delay module. Delay portion 1300 comprises a multiplexer 1310, a coarse delay module 1320, inverters 1330-1 through 1330-4, and a fine delay module 1340 (shown in more detail in FIG. 15). Input signals to the delay portion 1300 are DDLTST, TSTIN, IN, COARSE_CTL<31:0>, and FINE_CTL<1:0>. Output signals for the delay portion are CKOUT and OUTBX. The signals DDLTST and TSTIN are optional signals used for testing. In normal operation, the DDLTST will be set to a state that selects the IN clock signal. The COARSE_CTL<31:0> and FINE_CTL<1:0> are signals communicated from a delay processor (e.g., delay processor 120 of FIG. 1) to the digital delay module (e.g., digital delay module 140 of FIG. 1), typically over a bus (e.g., a delay value bus 125 of FIG. 1). Thus, the COARSE_CTL<31:0> and FINE_CTL<1:0> signals represent the delay value 122 of FIG. 1. The IN clock signal is an input clock signal, such as a reference clock 105 of FIG. 1. CKOUT is a delayed version of the IN signal. CKOUT is the output clock signal, such as the delay module clock output 145 of FIG. 1.

In the delay portion 1300, the coarse delay module 1320 is used to provide one of a number of coarse delays, and the fine delay module 1340 is used to provide one of a number of fine delays. In this example, there are 34 bits in the COARSE_CTL<31:0> and FINE_CTL<1:0> signals used for selecting a delay value, where the delay value corresponds to a given delay created on the IN clock signal. The CKOUT clock signal should be delayed, relative to the IN clock signal, by the given delay. The resolution provided by changing the Least Significant Bit (LSB) of the 34 bits (e.g., changing an LSB of the FINE_CTL<1:0> signals) can range, in an exemplary embodiment, between 5 picoseconds (ps) best case to 15 ps worst case, with about 10 ps being typical. Thus, in an exemplary embodiment, about 10 ps of delay is a resolution provided by the fine delay module 1340.

The coarse delay module 1320 comprises a number of delay elements 1350-1 through 1350-N. Each delay element 1350 is configurable, and configuration of the delay elements 1350 selects paths taken by the IN clock signal. In this example, there are paths 1360-1 through 1360-M. For instance, by properly configuring at least delay elements 1350-1 and 1350-2, path 1360-1 is created. As another example, by properly configuring at least delay elements 1350-1, 1350-2, 1350-3, and 1350-4, path 1360-2 is created. Similarly, by properly configuring all of the N delay elements 1350-1 through 1350-N, path 1360-M is created. Thus, each value of the COARSE_CTL<31:0> signals corresponds to a particular delay (e.g., modified somewhat by the fine delay module 1340). In FIG. 13, the delay elements 1350 are multiplexers, but other elements that can be configured to provide selective paths may be used. The resolution provided by changing the LSB of the COARSE_CTL<31:0> signals is typically about 40 ps. It should be noted that there are also non-configurable delay elements, such as the inverters 1330, in FIG. 13 and figures below.

Figure 14:
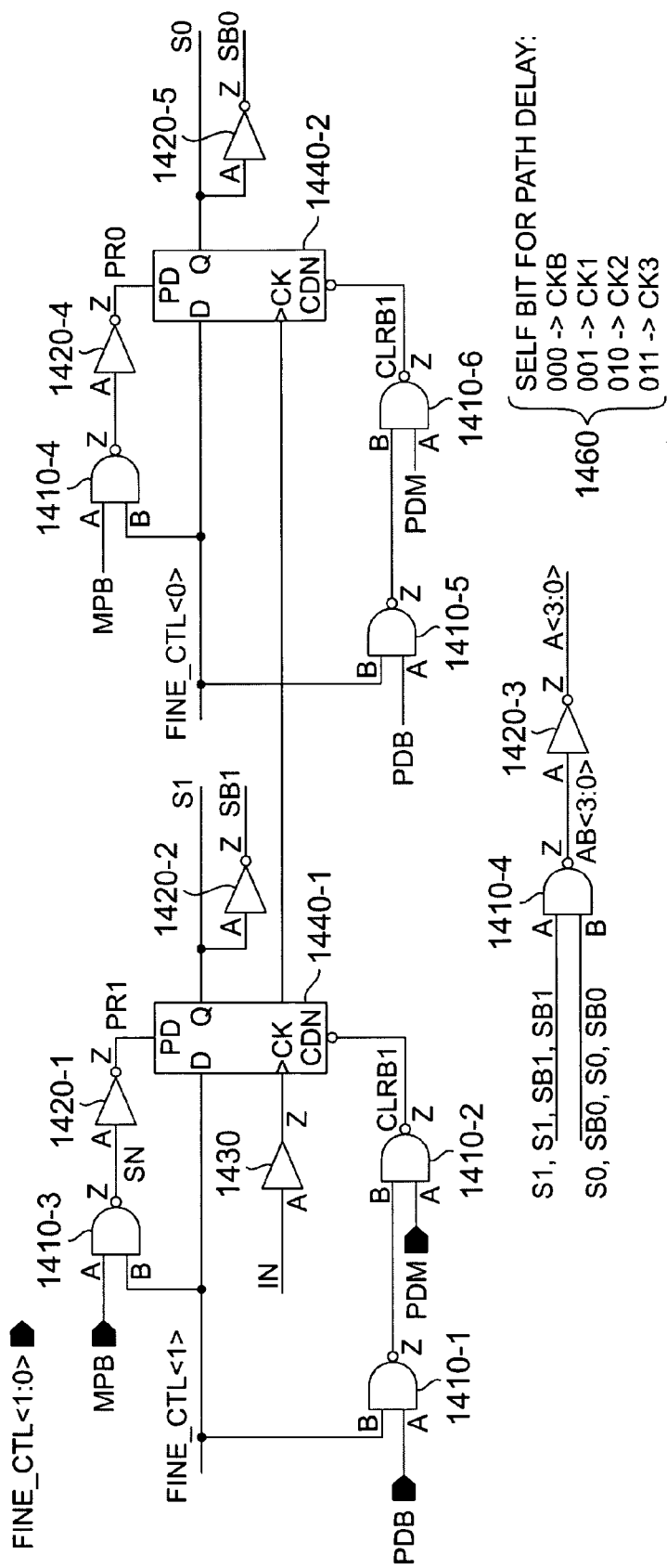
FIG. 14 is a circuit diagram of a synchronizer portion of an exemplary digital delay module.

FIG. 14 is a circuit diagram of a synchronizer portion 1400 of an exemplary digital delay module. The synchronizer portion 1400 comprises input signals FINE_CTL<1:0>, MPB, PDB, and PDM. The synchronizer portion 1400 produces the signals AB<3:0> and A<3:0>, which are coupled to the fine delay module (see FIG. 15). The synchronizer portion 1400 comprises NAND gates 1410-1 through 1410-4, inverters 1420-1 through 1420-5, buffer 1430, and D flip-flops 1440-1 and 1440-2. The D flip-flops 1440 have set (e.g., PD) and reset (e.g., CDN) inputs.

The synchronizer portion 1400 is implemented so that updating of the fine delay module (e.g., by modifying signals AB<3:0> and A<3:0>) is performed when phase of the input clock signal, IN, is high (e.g., or low). This prevents any glitches that may occur the output clock signal OUTB (see FIG. 15). Additionally, the synchronizer portion 1400, when the digital delay module is in a synchronous mode, will allow in an exemplary embodiment only one LSB change to the FINE_CTL<1:0> at a time.

As indicated in the table 1460, when the A<3:0> signals are 000, then clock signal path CKB is selected; when the A<3:0> signals are 001, then clock signal path CK1 is selected; when the A<3:0> signals are 010, then clock signal path CK2 is selected; and when the A<3:0> signals are 011, then clock signal path CK3 is selected. This is described in more detail in reference to FIG. 15.

Figure 15:
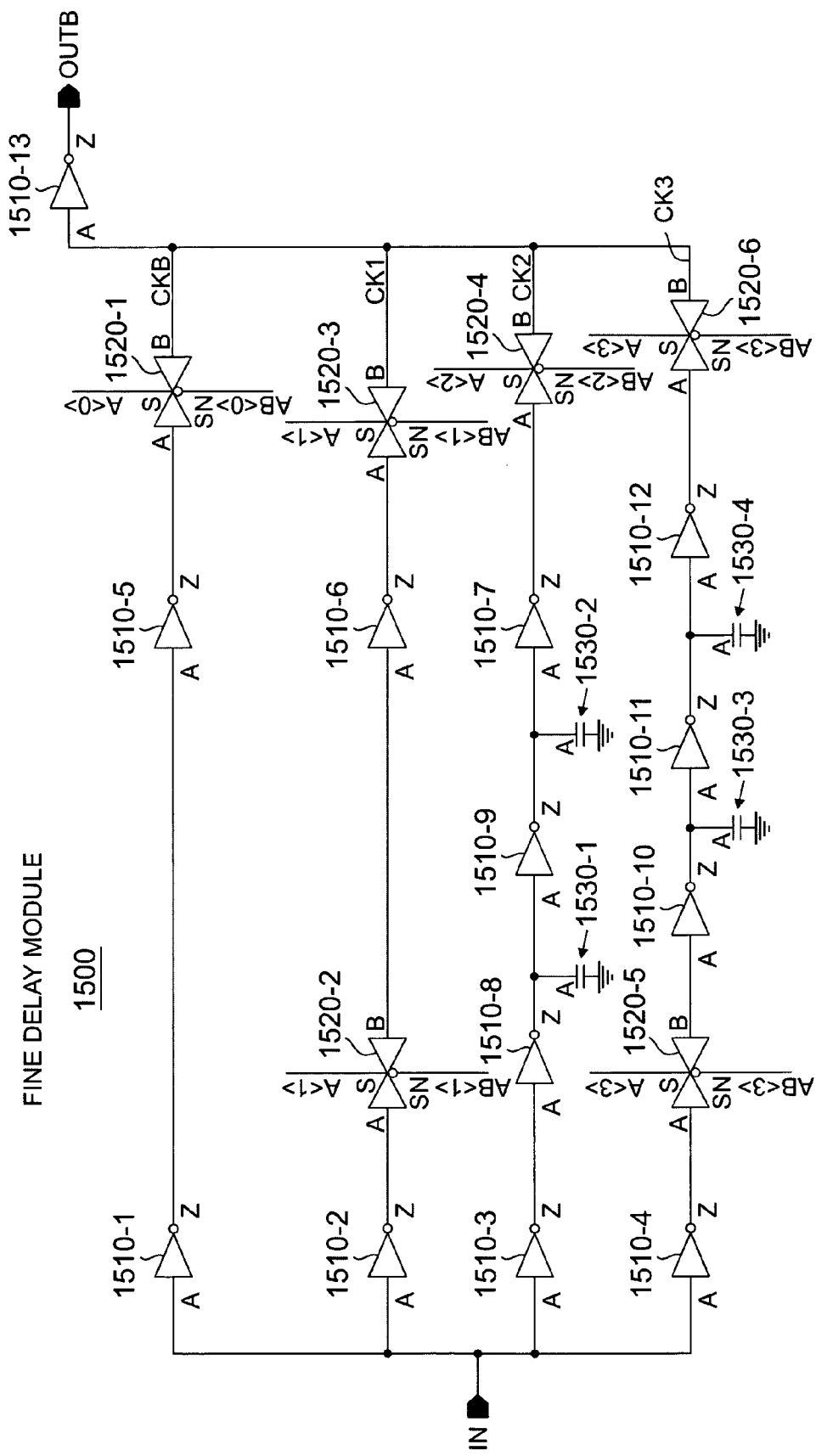
FIG. 15 is a circuit diagram of a fine delay module of an exemplary digital delay module.

Turning now to FIG. 15, a circuit diagram is shown of a fine delay module 1500 of an exemplary digital delay module. The fine delay module 1500 is an example of fine delay module 1340 of FIG. 13. The fine delay module 1500 accepts an input clock signal, IN (already delayed by passing through the coarse delay module 1320 of FIG. 13), and produces an output clock signal, OUTB. The output clock signal, OUTB, is the clock signal that is delayed by a delay corresponding to the delay value provided on COARSE_CTL<31:0> and FINE_CTL<1:0>. The fine delay module 1500 comprises inverters 1510-1 through 1510-13, transmission gates 1520-1 through 1520-6, and capacitors 1530-1 through 1530-4. The transmission gates 1520 are delay elements that are configurable to select paths through the fine delay module 1500. As described above, when the A<3:0> signals are 000, then clock signal path CKB is selected because the transmission gate 1520-1 is enabled and the transmission gates 1520-2 through 1520-6 are disabled. Similarly, when the A<3:0> signals are 001, then clock signal path CK1 is selected because the transmission gates 1520-2 and 1520-3 are enabled and the transmission gates 1520-1 and 1520-4 through 1520-6 are disabled. Similar operations will select clock signal path CK2, when the A<3:0> signals are 010, and clock signal path CK3, when the A<3:0> signals are 011. The clock signal path CKB provides the least amount of delay and the clock signal path CK3 provides the most amount of delay.

Although the coarse delay module 1320 and fine delay module 1340 are shown above as being separate, these modules can be combined. However, having these modules be separate is beneficial, as this allows both fine and coarse resolution delays, which can be harder to implement in a single structure. Additionally, separating out a module that implements fine resolution delays allows very fine resolution delays, such as 10 ps resolution of delay in the examples given above.

The previous circuits have been directed to phase alignment (e.g., a phase shift of zero) between two clock signals. However, the circuits may also be used to provide a non-zero phase shift. For example, turning back to FIG. 1, the digital phase alignment circuit 100 could be made to find two positive edges of the reference clock signal 105 in the delay range 210. Using delay values 122 corresponding to these two positive edges, the digital phase alignment circuit 100 can determine an appropriate value for a 90 degree phase shift. For instance, adding the two delay values and dividing by four provides a delay value equivalent to a 90 degree phase shift. In fact, any phase shift from minus 180 degrees to 180 degrees and corresponding delay values may be determined. The delay value corresponding to the desired phase shift can be loaded into the digital delay module 140. Unfortunately, this technique might not be able to adjust for clock drift.

However, the digital phase shift circuit 1600 shown in FIG. 16 can create any phase shift of the output clock 1690 relative to the reference clock 1605 and can adjust for clock drift. The digital phase shift circuit 1600 comprises a master delay module 1640-1, a phase detector 1610, a delay processor 1620, and a phase shift delay module 1640-2. Although not shown, a sequence control processor may also be used, if desired.

The phase detector 1610 compares the reference clock signal 1605 with the delay module clock output signal 1645 and determines a phase detector output 1615 corresponding to a phase relationship between the reference clock signal 1605 with the delay module clock output signal 1645. This has been described above. The delay processor 1620, through sending delay values (not shown in FIG. 1620) to the master delay module 1640-1 on master delay value bus 1625, can determine one UI for the reference clock signal 1605 through techniques described above. A value for the UI can be used to determine an appropriate delay value suitable to create a selected delay from minus 180 degrees to 180 degrees (e.g., 90 degrees or 180 degrees). The delay value can be communicated to the phase-shift delay module 1640-2 (e.g., on phase-shift delay value bus 1695). The delay value will cause the output clock 1690 to be phase shifted from the reference clock signal 1605 by a phase shift value.

The delay processor can, using techniques described above (including if desired the filtering parameter), adjust the delay value communicated to the phase-shift delay module 1640-2 for clock drift on the reference clock signal 1605 based on input from the phase detector 1610 and control of the master delay module 1640-1.

The exemplary methods and apparatus described above can be implemented to have one or more of the following advantages:

(1) Extremely short startup times. The startup times are based on the rate of the reference clock signal, and the faster the reference clock rate, the shorter the startup times.

(2) Once a system using an exemplary embodiment of the present invention has acquired alignment, the reference clock signal can be removed (e.g., made inactive). When the reference clock signal is active again, realignment of the reference clock signal and the tree clock signal can be achieved extremely quickly. If the absolute jitter in the reference clock signal is small, considering no drift in voltage and temperature, the system may be very close to alignment in the first few clock cycles of the recently activated reference clock signal.

(3) Exemplary embodiments of the present invention include a digital delay module. The digital delay module can cause ElectroMagnetic Interference (EMI) to be spread in time. Thus, EMI generated by the system can be reduced.

(4) Since a phase detector is constantly switching between two delay values in normal mode, the phase detector causes the frequency to be almost systematically distributed in two bins: one bin corresponds to a smaller period, while the other bin corresponds to a larger period. Since the delay elements are typically not well controlled, the chances are that the frequency may spread into more bins than just two.

(5) A system in accordance with an exemplary embodiment of the present invention can be much smaller in area than an analog PLL. For instance, an exemplary system can be as much as one-quarter the size of an analog PLL.

(6) Certain embodiments of the present invention can be designed to not filter high frequency jitter components. This is an advantage over conventional PLL applications, as the tree clock signal will jitter almost as the reference clock signal (e.g., there may be some jitter added by logic in the path from the reference clock signal to the tree clock signal).

(7) It is desirable to have same power supply that is used for the clock tree power the digital phase alignment circuit. Conventional PLLs typically have a different power supply than the power supply used by the clock tree. By having the power supplies be the same for both the clock tree and the digital phase alignment circuit, any variations in supply and temperature will have the same effect on the two circuits and some of the voltage and temperature oriented issues are mitigated.

(8) Smaller amounts of jitter can be added in the digital phase alignment circuit than the conventional PLL.

(9) The static phase error that comes into play can be much larger in a conventional PLL than in the circuits described above.

(10) The extra dummy delay modules, if used, in the path allow for a more accurate way of adding an offset. Offset can be characterized, determined, and used as percentage of UI.

(11) Embodiments are easily migrated to new technologies.

(12) Embodiments present a much simpler stability problem as compared to conventional PLLs.

(13) Embodiments of the present invention can be designed to use very low power relative to conventional PLLs.

(14) Embodiments can be implemented to correct for duty cycle error of the incoming reference clock signal. This is advantageous in systems that use both clock edges of the reference clock signal for signal processing.

It should be noted that embodiments of the present invention may be manufactured as integrated circuits. During integrated circuit manufacturing, a plurality of identical die are typically formed in a repeated pattern on a surface of a wafer. Each die may include a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

I claim:

1. A phase shift circuit for creating a second clock signal using a first clock signal, the phase shift circuit comprising:
   a phase detector suitable for coupling to the first and second clock signals, the phase detector configured to produce an output corresponding to a phase relationship between the first and second clock signals;
   a processor coupled to the phase detector and to a delay module, the processor configured to select, based at least partially on the output of the phase detector, a value corresponding to a given one of a plurality of delays, the processor further configured to communicate the value to the delay module; and
   the delay module coupled to the first clock signal and to the processor, the delay module configured to create, by using the value, the given delay on the first clock signal to produce the second clock signal;
   whereby the given delay creates a phase shift between the first and second clock signals;
   wherein the delay module comprises a plurality of configurable delay elements, wherein:
     a first of the delay elements is configured to provide one of a plurality of coarse delays; and
     a second of the delay elements is configured to provide one of a plurality of fine delays;
   a smallest of the coarse delays is larger than a smallest of the fine delays; and the first of the delay elements corresponds to a first portion of the value and the second of the delay elements corresponds to a second portion of the value.

2. The phase shift circuit of claim 1, wherein the processor is configured to select the given delay in order to create a given phase shift, wherein the given phase shift can range between minus 180 degrees and 180 degrees.

3. The phase shift circuit of claim 1, wherein the phase shift is zero degrees, when the first and second clock signals are aligned.

4. The phase shift circuit of claim 1, wherein the first and second clock signals are inputs to the phase detector and wherein the second clock signal passes through at least a portion of a clock tree prior to being input to the phase detector.

5. The phase shift circuit of claim 1, wherein the phase detector samples a state of the first clock by using an edge of the second clock and wherein the output of the phase detector corresponds to the sampled state.

6. The phase shift circuit of claim 5, wherein the edge is one of a positive edge or a negative edge.

7. The phase shift circuit of claim 1, wherein each of the plurality of configurable delay elements further comprises a plurality of delay elements, each of the configurable delay elements able to be configured by using the value to select one of a plurality of paths through the delay module.

8. The phase shift circuit of claim 1, wherein the phase shift circuit is a portion of an integrated circuit.

9. The phase shift circuit of claim 7, wherein the configurable delay elements comprise one or more of multiplexers and transmission gates.

10. The phase shift circuit of claim 7, wherein the delay module is configured to couple the value to the configurable delay elements and to direct the configurable delay elements to update a current value with a new value.

11. The phase shift circuit of claim 10, wherein the phase shift circuit is a portion of an integrated circuit.

12. The phase shift circuit of claim 10, wherein the delay module is configured to direct the configurable delay elements to update the current value with the new value when the first clock is in either a high state or a low state.

13. The phase shift circuit of claim 10, wherein the phase shift circuit further comprises a second processor, and wherein the second processor is adapted to communicate one or more signals to the delay module, the one or more signals directing the delay module as to when the current value is to be updated with the new value.

14. The phase shift circuit of claim 10, wherein the delay module is configured, when in a first state, to limit how much of the new value is used to update the current value if the new value is greater than a predetermined amount from the current value.

15. The phase shift circuit of claim 10, wherein the delay module is configured, when in a second state, to update the current value with the new value regardless of a difference between the current value and the new value.

16. The phase shift circuit of claim 1, wherein:
the given delay is a current delay that corresponds to a current value; and
the processor is configured to select a new value corresponding to a new delay, the processor selecting a new value that corresponds to a new delay that is larger than the current delay when the output of the phase detector is a first state and selecting a new value that corresponds to a new delay that is smaller than the current delay when the output of the phase detector is a second state.

17. The phase shift circuit of claim 1, wherein:
the given delay is a current delay that corresponds to a current value;
the processor is configured to select a new value that corresponds to a new delay that is larger than the current delay when the output of the phase detector is a first state for a predetermined number of times; and
the processor is adapted to select a new value that corresponds to a new delay that is smaller than the current delay when the output of the phase detector is a second state for a predetermined number of times.

18. The phase shift circuit of claim 1, wherein:
the plurality of delays correspond to a delay range; and
the processor is configured to select a plurality of values in order to determine at least one value that corresponds to at least one edge of the first clock signal in the delay range.

19. The phase shift circuit of claim 18, wherein the processor is configured to determine each of the at least one values by:
(a) selecting a first value and communicating the first value to the delay module;
(b) examining the output of the phase detector;
(c) selecting a second value and communicating the second value to the delay module;
(d) examining the output of the phase detector; and
(e) performing the steps of (a) through (d) until the output of the phase detector changes state.

20. The phase shift circuit of claim 18, wherein the at least one value is a single value that corresponds to a single edge of the first clock signal, the single edge is an edge selected to be nearest of a plurality of edges to a middle of the delay range.

21. The phase shift circuit of claim 18, wherein the at least one value is a plurality of values that correspond to a plurality of edges of the first clock signal in the delay range.

22. The phase shift circuit of claim 1, wherein:
the phase detector is a first phase detector;
the processor is a first processor that selects a first value corresponding to a first given delay of the plurality of first delays;
the delay module is a first delay module that creates a first given delay on the first clock signal; and
the phase shift circuit further comprises:
a second phase detector suitable for coupling to the first clock signal and a third clock signal, the second phase detector configured to produce an output corresponding to a phase relationship between the first and third clock signals;
a second processor coupled to the second phase detector and to a second delay module, the second processor adapted to select, based at least partially on the output of the second phase detector, a second value corresponding to a given one of a plurality of second delays, the processor further configured to communicate the value to the second delay module; and
the second delay module coupled to the third clock signal and to the second processor, the second delay module configured to create, by using the second value, the second given delay on the first clock signal to produce the third clock signal;
a multiplexer coupled to the second and third clock signals and adapted to select one of the second or third clock signals as an output clock signal of the phase shift circuit.

23. The phase shift circuit of claim 22, wherein the phase shift circuit is a portion of an integrated circuit.

24. The phase shift circuit of claim 22, further comprising a third processor coupled to the first and second processors, the first and second delay modules, and the multiplexer.

25. The phase shift circuit of claim 24, wherein the third processor is configured to direct the multiplexer to switch between the second and third clock signals when both the second and the third clock signals are a stable value.

26. The phase shift circuit of claim 24, wherein:
the plurality of first delays correspond to a first delay range;
the first processor is configured to select one or more first values in order to align an edge of the second clock signal with a first selected edge of the first clock signal, wherein the first selected edge is an edge selected to be nearest of a plurality of edges of the first clock signal to a middle of the first delay range;
the plurality of second delays correspond to a second delay range;
the second processor is configured to select one or more second values in order to align an edge of the third clock signal with a second selected edge of the first clock signal, wherein the second selected edge is an edge selected to be nearest of a plurality of edges of the first clock signal to a middle of the second delay range.

27. The phase shift circuit of claim 26, wherein:
the first processor is configured to continue to select the one or more values in order to align an edge of the second clock signal with the first selected edge, regardless of whether the first selected edge drifts in the first delay range;
the second processor is configured to select the one or more second values in order to align an edge of the third clock signal with whatever edge of the first clock signal is nearest of a plurality of edges of the first clock signal to a middle of the second delay range; and
the third processor is configured to direct the multiplexer to select the third clock signal when the first selected edge drifts in the first delay range so that a position of the first selected edge is greater than a predetermined position, the predetermined position corresponding to a particular first value of the plurality of first values.

28. The phase shift circuit of claim 22, further comprising first and second dummy delay modules, the first dummy delay module intermediate the first clock signal and the first phase detector, the second dummy delay module coupled to the output signal and producing a second output signal that is a delayed version of the first output signal.

29. The phase shift circuit of claim 28, wherein:
the plurality of first delays correspond to a first delay range;
the first processor is configured to determine at least two first values that correspond to at least two first edges of the first clock signal in the first delay range and is adapted to determine a unit interval using the at least two first two edges;
the first dummy module is configured to create a first dummy delay on the first clock signal, the first dummy delay being a predetermined fraction of the unit interval; and
the second dummy module is configured to create a second dummy delay on the output clock signal, the second dummy delay being the predetermined fraction of the unit interval.

30. The phase shift circuit of claim 1, wherein:
the delay module is a first delay module;
the plurality of delays correspond to a delay range;
the first processor is configured:
to determine a first value that is used to align an edge of the second clock signal with a first selected edge of the first clock signal;
to determine a second value that is used to align an edge of the second clock signal with a second selected edge of the first clock signal;
to determine, by using the first and second values, a third value that will cause a predetermined phase shift of the first clock signal; and
to communicate the third value to a second delay module; and the phase shift circuit further comprises the second delay module, the second delay module coupled to the first clock signal and to the processor, the second delay module adapted to create, by using the third value, a delay on the first clock signal to produce an output clock signal;
whereby the output clock signal is a delayed version of the first clock signal and is phase shifted, relative to the first clock signal, by the predetermined phase shift.

31. A method for creating a second clock signal using a first clock signal, the method comprising the steps of:
determining an output corresponding to a phase relationship between the first and second clock signals;
selecting, based at least partially on the output, a value corresponding to a given one of a plurality of delays, wherein said value comprises a coarse delay value and a fine delay value; and
creating, by using the value, the given delay on the first clock signal to produce the second clock signal;
whereby the given delay creates a phase shift between the first and second clock signals.

32. A phase shift circuit for creating a second clock signal using a first clock signal, the phase shift circuit comprising:
means for determining an output corresponding to a phase relationship between the first and second clock signals;
means for selecting, based at least partially on the output, a value corresponding to a given one of a plurality of delays, wherein said value comprises a coarse delay value and a fine delay value; and
means for creating, by using the value, the given delay on the first clock signal to produce the second clock signal;
whereby the given delay creates a phase shift between the first and second clock signals.

33. An integrated circuit comprising one or more phase shift circuits and first and second clock signal lines suitable for carrying first and second clock signals, a given one of the phase shift circuits for creating the second clock signal using the first clock signal, the given phase shift circuit comprising:
a phase detector suitable for coupling to the first and second clock signals, the phase detector configured to produce an output corresponding to a phase relationship between the first and second clock signals;
a processor coupled to the phase detector and to a delay module, the processor configured to select, based at least partially on the output of the phase detector, a value corresponding to a given one of a plurality of delays, the processor further configured to communicate the value to the delay module; and
the delay module coupled to the first clock signal and to the processor, the delay module configured to create, by using the value, the given delay on the first clock signal to produce the second clock signal;
whereby the given delay creates a phase shift between the first and second clock signals;
wherein the delay module comprises a plurality of configurable delay elements, wherein:

a first of the delay elements is configured to provide one of a plurality of coarse delays; and
a second of the delay elements is configured to provide one of a plurality of fine delays;
a smallest of the coarse delays is larger than a smallest of the fine delays; and the first of the delay elements corresponds to a first portion of the value and the second of the delay elements corresponds to a second portion of the value.

* * * * *